(12) United States Patent
Obata et al.

(10) Patent No.: US 9,293,663 B1
(45) Date of Patent: Mar. 22, 2016

(54) LIGHT-EMITTING UNIT AND SEMICONDUCTOR LIGHT-EMITTING DEVICE

(71) Applicant: KABUSHIKI KAISHA TOSHIBA, Tokyo (JP)

(72) Inventors: Susumu Obata, Nonoichi Ishikawa (JP); Akihiro Kojima, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/634,886

(22) Filed: Mar. 1, 2015

(30) Foreign Application Priority Data

Sep. 16, 2014 (JP) ................................. 2014-187250

(51) Int. Cl.
| | |
|---|---|
| *H01L 33/62* | (2010.01) |
| *H01L 33/48* | (2010.01) |
| *H01L 33/38* | (2010.01) |
| *H01L 33/56* | (2010.01) |
| *H01L 33/50* | (2010.01) |
| *H01L 33/58* | (2010.01) |
| *H01L 27/15* | (2006.01) |

(52) U.S. Cl.
CPC .............. *H01L 33/486* (2013.01); *H01L 27/15* (2013.01); *H01L 33/38* (2013.01); *H01L 33/50* (2013.01); *H01L 33/56* (2013.01); *H01L 33/58* (2013.01)

(58) Field of Classification Search
USPC .......................................................... 257/91
See application file for complete search history.

(56) References Cited

U.S. PATENT DOCUMENTS

| | | | | |
|---|---|---|---|---|
| 8,334,548 B2 * | 12/2012 | Kobayakawa | ........ | H01L 33/486 257/100 |
| 8,860,066 B2 * | 10/2014 | Mineshita | ............. | H01L 33/486 257/99 |
| 2011/0073889 A1 | 3/2011 | Sugizaki et al. | | |
| 2014/0175471 A1 * | 6/2014 | Akimoto | ............... | H01L 27/156 257/91 |
| 2014/0284754 A1 * | 9/2014 | Yamamoto | ........ | H01L 23/49551 257/487 |
| 2015/0076546 A1 | 3/2015 | Obata et al. | | |

FOREIGN PATENT DOCUMENTS

| | | |
|---|---|---|
| JP | 2004039691 A | 2/2004 |
| JP | 2011044722 A | 3/2011 |
| JP | 2012114370 A | 6/2012 |
| JP | 2013-38212 A | 2/2013 |

* cited by examiner

*Primary Examiner* — Thao P Le
(74) *Attorney, Agent, or Firm* — Patterson & Sheridan, LLP

(57) ABSTRACT

A light-emitting unit is provided including a mounting substrate and a semiconductor light-emitting device. The mounting substrate includes a first pad, a second pad, and one or more third pads provided between the first pad and the second pad. The semiconductor light-emitting device includes a plurality of light-emitting elements having a first light-emitting element and a second light-emitting element separated in a first direction. Each light-emitting element includes a first external terminal and a second external terminal separated in the first direction. A first external terminal of the first light-emitting element is bonded to the first pad. A second external terminal of the first light-emitting element and a first external terminal of the second light-emitting element are each bonded to one of the one or more third pads. A second external terminal of the second light-emitting element is bonded to the second pad.

20 Claims, 13 Drawing Sheets

LIGHT-EMITTING UNIT AND SEMICONDUCTOR LIGHT-EMITTING DEVICE

CROSS-REFERENCE TO RELATED APPLICATION

This application is based upon and claims the benefit of priority from Japanese Patent Application No. 2014-187250, filed Sep. 16, 2014, the entire contents of which are incorporated herein by reference.

FIELD

Embodiments described herein relate generally to a light-emitting unit and a semiconductor light-emitting device.

BACKGROUND

A semiconductor light-emitting device in which a single LED chip is included in a package is known. In a semiconductor light-emitting device incorporating multiple chips within a single package, the chips are typically interconnected by bonding wires and/or wiring layers on a printed circuit board substrate. However, generally, these interconnection methods require large spacing between adjacent chips in the package to accommodate bonding/soldering methods and thus the size and cost of the multiple chip package is increased.

DETAILED DESCRIPTION

Figure 1:
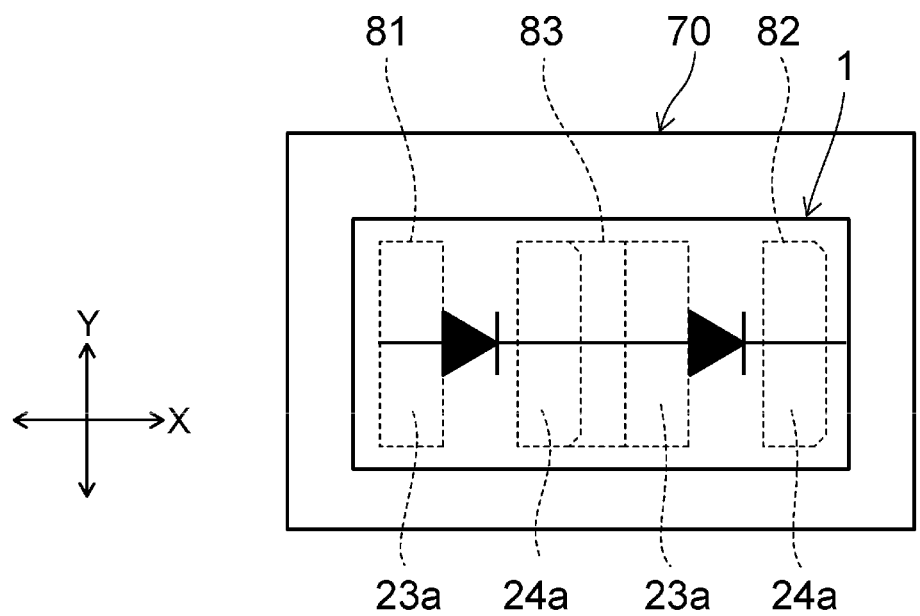
FIG. 1 is a plan view schematically illustrating a light-emitting unit according to a first embodiment.

The exemplary embodiments described herein provide a light-emitting unit and a semiconductor light-emitting device in which a plurality of light-emitting elements are connected to each other with a simple structure in a multi-chip package.

In general, according to one embodiment, a light-emitting unit includes a first pad on a mounting substrate and a second pad on the mounting substrate. The first and second pads are spaced from each other in a first direction along (parallel to) the mounting substrate. A third pad is disposed on the mounting substrate between the first pad and the second pad in the first direction. In some embodiments, additional pads may be disposed on the mounting substrate. A semiconductor light-emitting device including a resin layer that supports a first light-emitting element and a second light-emitting element is provided. The first and second light-emitting elements each respectively have first and second external terminals which extend through the resin layer to a first surface of the resin layer facing the mounting substrate. The first external terminal of the first light-emitting element is mounted (e.g., soldered or otherwise bonded or joined) on the first pad. The second external terminal of the first light-emitting element is mounted on the third pad. The first external terminal of the second light-emitting element is mounted on the third pad. The second external terminal of the second light-emitting element is mounted on the second pad.

In general, according to another embodiment, a light-emitting unit includes: a mounting substrate and a semiconductor light-emitting device. The mounting substrate includes a first pad, a second pad, and a third pad provided between the first pad and the second pad. The semiconductor light-emitting device includes a plurality of light-emitting elements each of which includes two external terminals and a resin layer integrally supporting the plurality of light-emitting elements. The plurality of light-emitting elements include n (n is an integer equal to or greater than two) light-emitting elements disposed in a first direction. (2×n) external terminals of the n light-emitting elements are disposed in the first direction. Among the (2×n) external terminals, an external terminal at one end in the first direction is bonded to the first pad, an external terminal at the other end in the first direction is bonded to the second pad, and an external terminal between the external terminal at the one end and the external terminal at the other end is bonded to the third pad.

Hereinafter, the description is given of an example embodiment with reference to the drawings. In the drawings, reference numerals for the same or substantially similar elements depicted in one or more drawings are the same in the each of the drawings.

BRIEF DESCRIPTION OF THE DRAWINGS

FIG. 1 is a plan view schematically illustrating a light-emitting unit according to a first embodiment.

Figure 2A:
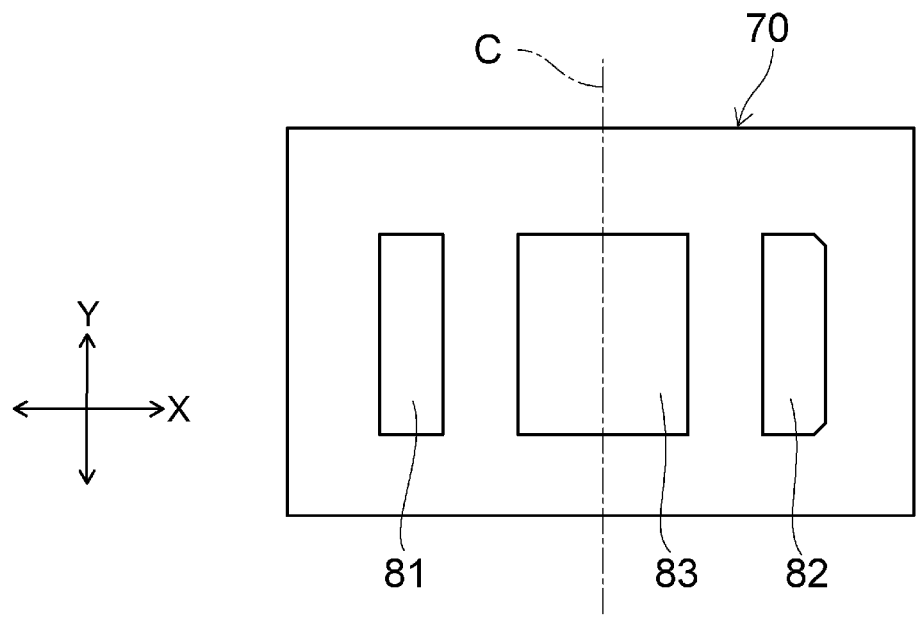
FIG. 2A is a plan view schematically illustrating a mounting substrate of the first embodiment.

FIG. 2A is a plan view schematically illustrating a mounting substrate according to the first embodiment.

Figure 2B:
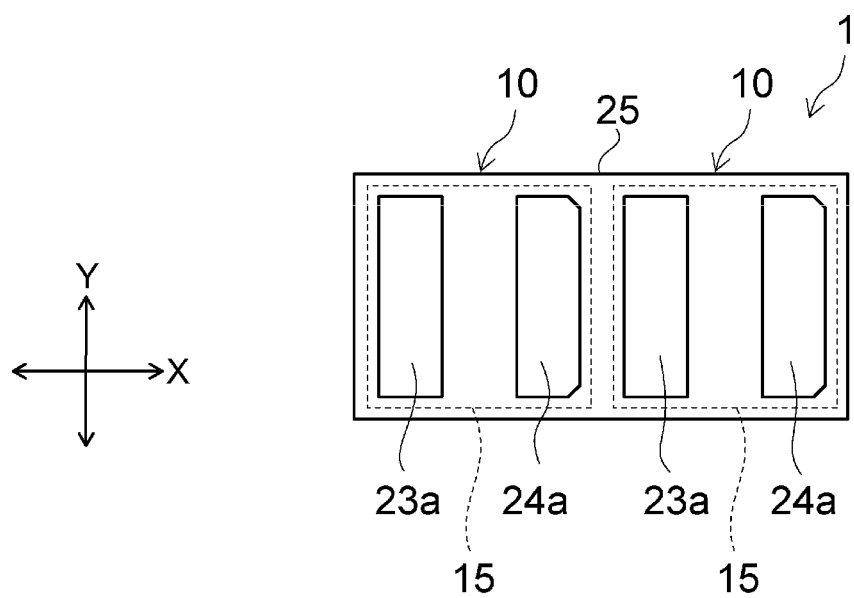
FIG. 2B is a plan view schematically illustrating a semiconductor light-emitting device according to the first embodiment.

FIG. 2B is a plan view schematically illustrating a semiconductor light-emitting device according to the first embodiment.

Figure 3:
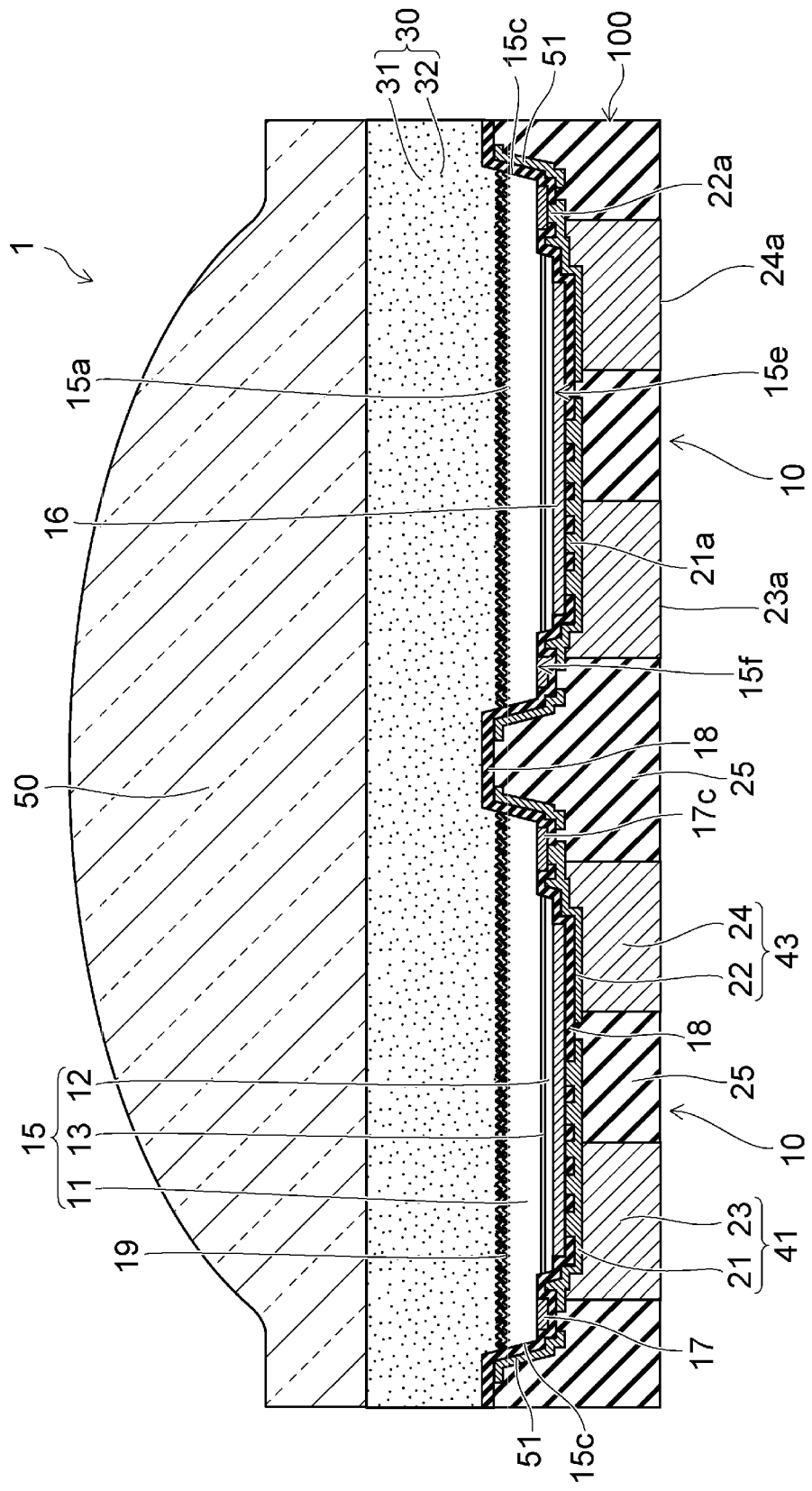
FIG. 3 is a cross-sectional view schematically illustrating a semiconductor light-emitting device according to the first embodiment.

FIG. 3 is a cross-sectional view schematically illustrating the semiconductor light-emitting device according to the first embodiment.

FIG. 2B illustrates a mounted surface of the semiconductor light-emitting device according to the first embodiment and corresponds to a bottom view of the semiconductor light-emitting device as illustrated in FIG. 3.

First Embodiment

FIG. 1 illustrates a state where the mounted surface of the semiconductor light-emitting device 1 as illustrated in FIG. 2B is connected to pads 81 to 83 on the mounting substrate as illustrated in FIG. 2A. FIG. 1 is a plan view schematically illustrating a light-emitting unit when viewed from a top surface side (the opposite side of the mounted surface) of the semiconductor light-emitting device 1 in a state where the semiconductor light-emitting device 1 is mounted on the mounting substrate 70.

The semiconductor light-emitting device 1 includes a plurality of light-emitting elements 10. In examples illustrated in FIG. 1, FIG. 2B, and FIG. 3, the semiconductor light-emitting device 1 includes, for example, two light-emitting elements 10. The plurality of light-emitting elements 10 are packaged by using a resin layer 25 at a wafer level and the resin layer 25 integrally supports the plurality of light-emitting elements 10.

An outer shape of the semiconductor light-emitting device 1 when viewed from the top surface or the mounted surface of the opposite side of the top surface is, for example, rectangular. For example, the two light-emitting elements 10 are disposed side by side in a longitudinal direction (in a first direction X) in the rectangle. The light-emitting elements 10 have the same configuration.

As illustrated in FIG. 3, the light-emitting element 10 is provided with a semiconductor layer 15 including a light emitting layer 13. The semiconductor layer 15 includes one side (the first side) 15a (FIG. 3) in the thickness direction and an opposite side (the second side) 15b (FIG. 4).

Figure 4:
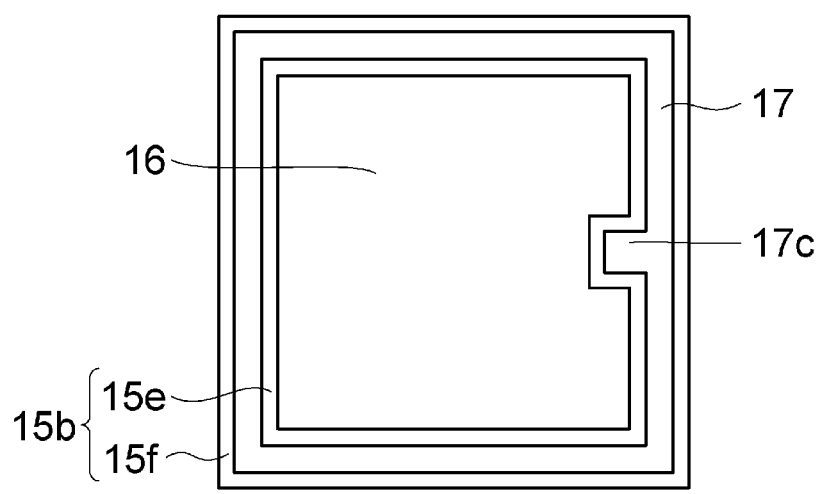
FIG. 4 is a plan view schematically illustrating an electrode layout of a semiconductor light-emitting device according to the first embodiment.

FIG. 4 is a plan view schematically illustrating the second side 15b of the semiconductor layer 15 in one light-emitting element 10 and illustrates an example of a planar layout of a p-side electrode 16 and an n-side electrode 17.

The second side 15b of the semiconductor layer 15 includes a portion (light-emitting area) 15e including the light emitting layer 13 and a portion 15f not including the light emitting layer 13. The portion 15e is a portion of the semiconductor layer 15 in which the light emitting layer 13 is present. The portion 15f is a portion of the semiconductor layer 15 in which the light emitting layer 13 is not present. The portion 15e indicates an area having a laminated structure from which the light emitted from light emitting layer 13 is extracted to the outside (a light emission face).

On the second side 15b, the p-side electrode 16 is provided on the portion 15e as the first electrode, and the n-side electrode 17 is provided on the portion 15f as the second electrode.

As shown in FIG. 4, the portion 15f surrounds the portion 15e and the n-side electrode 17 surrounds the p-side electrode 16.

An electric current is supplied to the light emitting layer 13 via the p-side electrode 16 and the n-side electrode 17 so that the light emitting layer 13 emits light. Then, the light radiated from the light emitting layer 13 is output to the outside of the semiconductor light-emitting device 1 from the first side 15a.

A support 100 is provided on the second side 15b of the semiconductor layer 15 as illustrated in FIG. 3. The light-emitting element 10 including the semiconductor layer 15, the p-side electrode 16, and the n-side electrode 17 is supported by the support 100 provided on the second side 15b.

A phosphor layer 30 is provided on the first side 15a of the semiconductor layer 15 as an optical layer which imparts a desired optical property to the emitted light of the semiconductor light-emitting device 1. The phosphor layer 30 includes a plurality of particulate phosphors 31. The phosphors 31 are excited by the radiated light from the light emitting layer 13 so as to radiate light of a wavelength different from the radiated light from the light emitting layer 13. In this context, an "optical layer" is a layer and/or film which transmits at least a portion of light at a wavelength emitted from light emitting layer 13. The expression "transmit" is not limited to 100% of transmittance but includes a case where a portion of light is absorbed, reflected, and/or scattered.

The plurality of phosphors 31 are integrated by a binding material 32. The binding material 32 transmits the radiated light from the light emitting layer 13 and the radiated light from the phosphors 31.

The semiconductor layer 15 includes a first semiconductor layer 11, a second semiconductor layer 12, and the light emitting layer 13. The light emitting layer 13 is provided between the first semiconductor layer 11 and the second semiconductor layer 12. The first semiconductor layer 11 and the second semiconductor layer 12 contain, for example, gallium nitride.

The first semiconductor layer 11 includes, for example, a foundation buffer layer and an n-type GaN layer. The second semiconductor layer 12 includes, for example, a p-type GaN layer. The light emitting layer 13 includes a material which emits blue light, purple light, violet light, ultraviolet light, or the like. The emission peak wavelength of the light emitting layer 13 is within the range of, for example, 430 nm to 470 nm.

The second side 15b of the semiconductor layer 15 is processed into an uneven shape. A protruding portion 15e 15e includes the light emitting layer 13 and a recess portion 15f does not include the light emitting layer 13. The lower (as depicted in FIG. 3) surface of the portion 15e is a surface of the second semiconductor layer 12 and the p-side electrode 16 is provided on the surface of the second semiconductor layer 12. The lower (as depicted in FIG. 3) surface of the portion 15f is a surface of the first semiconductor layer 11 and the n-side electrode 17 is provided on the surface of the first semiconductor layer 11.

On the second side 15b of the semiconductor layer 15, an overall surface area of the portion 15e is greater than an overall surface area of the portion 15f. In addition, an area of the p-side electrode 16 which is provided on the surface of the portion 15e is greater than an area of the n-side electrode 17 on the surface of the portion 15f. In this manner, it is possible to obtain a large surface area for light emission and to increase optical output.

As illustrated in FIG. 4, the n-side electrode 17 includes, for example, four linear portions and the contact portion 17c, which projects in the width direction of the linear portion, is provided in one of the linear portions. As illustrated in FIG. 3, a via hole 22a of an n-side wire layer 22 is connected to the surface of the contact portion 17c.

The second side 15b of the semiconductor layer 15, the p-side electrode 16, and the n-side electrode 17 are covered by an insulating film (a first insulating film) 18 as illustrated in FIG. 3. The insulating film 18 is, for example, an inorganic insulating film, such as a silicon oxide film. The insulating film 18 is also provided on the side surfaces of the light emitting layer 13 and the side surfaces of the second semiconductor layer 12 so as to cover the side surfaces.

In addition, the insulating film 18 is also provided on the side surface 15c of the first semiconductor layer 11 to the first side 15a of the semiconductor layer 15 so as to cover the side surface 15c.

Furthermore, the insulating film 18 is provided on an outer peripheral portion of a chip surrounding the side surface 15c of the semiconductor layer 15. The insulating film 18 which is provided on the outer peripheral portion of the chip extends in a direction far from the side surface 15c towards the first side 15a.

A p-side wire layer 21 as a first wire layer and the n-side wire layer 22 as a second wire layer which are separated from each other are provided on the insulating film 18 on the second side 15b. A plurality of first openings which lead to the p-side electrode 16 and a second opening which leads to the contact portion 17c of the n-side electrode 17 are formed in the insulating film 18.

The p-side wire layer 21 is provided on the insulating film 18 and is provided inside the first opening. The p-side wire layer 21 is electrically connected to the p-side electrode 16 through a via hole 21a provided in the first opening.

The n-side wire layer 22 is provided on the insulating film 18 and is provided inside the second opening. The n-side wire layer 22 is electrically connected to the contact portion 17c of the n-side electrode 17 through the via hole 22a provided in the second opening.

The p-side wire layer 21 and the n-side wire layer 22 occupy a large portion of the area of the second side 15b and extend over the insulating film 18. The p-side wire layer 21 is connected to the p-side electrode 16 through a plurality of via holes 21a.

In addition, a reflecting film 51 covers the side surface 15c of the semiconductor layer 15 via the insulating film 18. The reflecting film 51 does not come in contact with the side surface 15c and is not electrically connected to the semiconductor layer 15. The reflecting film 51 is separated from the p-side wire layer 21 and the n-side wire layer 22. The reflecting film 51 has the reflectance with respect to the radiated light from the light emitting layer 13 and the radiated light from the phosphors 31.

Figure 5:
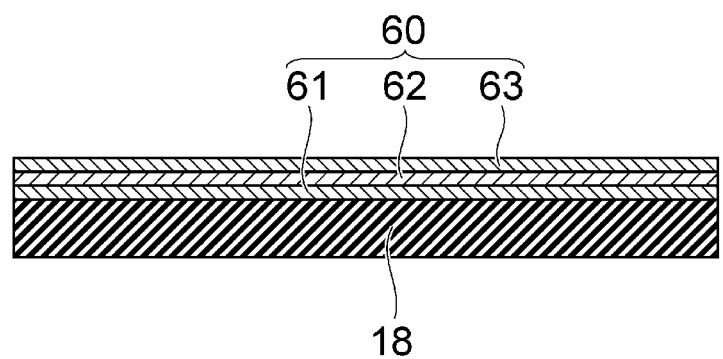
FIG. 5 is a cross-sectional view schematically illustrating a semiconductor light-emitting device according to the first embodiment.

The reflecting film 51, the p-side wire layer 21, and the n-side wire layer 22 include, for example, copper films. The reflecting film 51, the p-side wire layer 21, and the n-side wire layer 22 are concurrently formed on a common portion of a metallic film 60 as illustrated in FIG. 5 by means of, for example, an electroplating method. The thickness of each of the reflecting film 51, the p-side wire layer 21, and the n-side wire layer 22 is greater than that of the metallic film 60.

The metallic film 60 includes a foundation metallic film 61, an adhesion layer 62, and a seed layer 63 which are laminated in order from the insulating film 18 side.

The foundation metallic film 61 which has the high reflectance with respect to the radiated light from the light emitting layer 13 is, for example, an aluminum film.

The seed layer 63 is a copper film formed by reducing copper through an electroplating method. The adhesion layer 62 is, for example, a titanium film which is excellent in wettability with respect to both the aluminum and the copper.

Meanwhile, in the outer peripheral portion of the chip adjacent to the side surface 15c of the semiconductor layer 15, the reflecting film 51 may be formed of the metallic film 60 without forming a plated film (the copper film) on the metallic film 60. The reflecting film 51 includes the aluminum film 61 at least, and thus has the high reflectance with respect to the radiated light of the light emitting layer 13 and the radiated light of the phosphors 31.

In addition, since the foundation metallic film (an aluminum film) 61 remains below the p-side wire layer 21 and the n-side wire layer 22, the aluminum film 61 is formed to extend over large portions of the area of the second side 15b. For this reason, it is possible to increase an amount of the light directed to the phosphor layer 30 side.

A p-side metal pillar 23 is provided as a first metal pillar on a surface of the p-side wire layer 21 on the opposite side of the p-side wire layer 21 from the semiconductor layer 15. A p-side wire portion (a first wire portion) 41 is formed of the p-side wire layer 21 and the p-side metal pillar 23.

An n-side metal pillar 24 is provided as a second metal pillar on a surface of the n-side wire layer 22 on the opposite side of the n-side wire layer 22 from the semiconductor layer 15. An n-side wire portion (a second wire portion) 43 is formed of the n-side wire layer 22 and the n-side metal pillar 24.

The resin layer 25 is provided between the p-side wire portion 41 and the n-side wire portion 43 as a second insulating film. The resin layer 25 is provided between the p-side metal pillar 23 and the n-side metal pillar 24 so as to come in contact with the side surface of the p-side metal pillar 23 and the side surface of the n-side metal pillar 24. In other words, a space between the p-side metal pillar 23 and the n-side metal pillar 24 is filled with the resin layer 25.

In addition, the resin layer 25 is provided between the p-side wire layer 21 and the n-side wire layer 22, between the p-side wire layer 21 and the reflecting film 51, and between the n-side wire layer 22 and the reflecting film 51.

The resin layer 25 is provided at the periphery of the p-side metal pillar 23 and the periphery of the n-side metal pillar 24 so as to cover the side surfaces of the p-side metal pillar 23 and the side surfaces of the n-side metal pillar 24.

Further, the resin layer 25 is provided at the outer peripheral portion of the chip which is adjacent to the side surface 15c of the semiconductor layer 15 and provided between a plurality of semiconductor layers 15 which are separated from each other so as to cover the reflecting film 51.

An end portion (surface) of the p-side pillar 23 on the opposite side of the p-side pillar 23 from the p-side wire layer 21 is exposed from the resin layer 25 and functions as a p-side external terminal 23a capable of being connected to the outside circuit. An end portion (surface) of the n-side pillar 24 on the opposite side of the n-side pillar 24 from the n-side wire layer 22 is exposed from the resin layer 25 and functions as an n-side external terminal 24a capable of being connected to the outside circuit. As will be described below, the p-side external terminal 23a and the n-side external terminal 24a are bonded to pads 81 to 83 of the mounting substrate 70 as illustrated in FIG. 2A via, for example, a solder or a conductive bonding material such as a paste.

As illustrated in FIG. 2B, the p-side external terminal 23a is, for example, formed in the rectangular shape and the n-side external terminal 24a is formed in a shape in which two corners of a rectangle having the same size as that of the rectangle of the p-side external terminal 23a are cut out. Thus, it is possible to determine the polarity of the external terminal by looking at the terminals 23a, 24a. Note that, the n-side external terminal 24a may be formed in a rectangular shape and the p-side external terminal 23a may be formed in a shape in which two corners of the rectangle are cut out.

A gap between the p-side external terminal 23a and the n-side external terminal 24a is larger than a gap between the p-side wire layer 21 and the n-side wire layer 22 on the insulating film 18. The gap between the p-side external terminal 23a and the n-side external terminal 24a is set to be larger than the area occupied by the solder after mounting.

Therefore, it is possible to prevent a short circuit between the p-side external terminal 23a and the n-side external terminal 24a via the solder.

In contrast, the gap between the p-side wire layer 21 and the n-side wire layer 22 may be narrowed up to the limit of the patterning process used in making the LED. For this reason, the area of the p-side wire layer 21 and the area where the p-side wire layer 21 comes in contact with the p-side metal pillar 23 may be enlarged relative to the p-side external terminal 23a. Therefore, it is possible to improve dissipation of the heat generated in the light emitting layer 13.

In addition, the area where the p-side wire layer 21 comes in contact with the p-side electrode 16 via a plurality of via holes 21a is wider than the area where the n-side wire layer 22 comes in contact with the n-side electrode 17 via the via hole 22a. For this reason, the distribution of the electric current flowing into the light emitting layer 13 may be uniform.

The area of the n-side wire layer 22 extending over the insulating film 18 may be wider than the area of the n-side electrode 17. In addition, the area (the area of the n-side external terminal 24a) of the n-side metal pillar 24 provided on the n-side wire layer 22 may be larger than the area of the n-side electrode 17. Accordingly, it is possible to secure the area of the n-side external terminal 24a sufficient for mounting and to reduce the area of the n-side electrode 17. That is, it is possible to improve the optical output of the light emitting layer 13 by reducing the area of the portion 15f not including the light emitting layer 13 and extending the area of the portion (light-emitting area) 15e including the light emitting layer 13.

The first semiconductor layer 11 is electrically connected to the n-side metal pillar 24 via the n-side electrode 17 and the n-side wire layer 22. The second semiconductor layer 12 is electrically connected to the p-side metal pillar 23 via the p-side electrode 16 and the p-side wire layer 21.

The thickness of the p-side metal pillar 23 (the thickness in the direction coupling the p-side wire layer 21 and the p-side external terminal 23a) is greater than the thickness of the p-side wire layer 21. The thickness of the n-side metal pillar 24 (the thickness in the direction coupling the n-side wire layer 22 and the n-side external terminal 24a) is greater than the thickness of the n-side wire layer 22. The thicknesses of the p-side metal pillar 23, the n-side metal pillar 24, and the resin layer 25 are each greater than the thickness of the semiconductor layer 15.

An aspect ratio (a ratio of thickness to horizontal size) of the metal pillars 23 and 24 may be 1 or greater or may be smaller than 1. In other words, the thickness of the metal pillars 23 and 24 may be greater than or smaller than the horizontal size.

The support 100 includes the resin 25, the p-side wire layer 21, the n-side wire layer 22, the p-side metal pillar 23, and the n-side metal pillar 24. The thickness of the support 100 is thicker than the thickness of the light-emitting element (an LED chip) 10 including the semiconductor layer 15, the p-side electrode 16, and the n-side electrode 17.

The semiconductor layer 15 is formed on the substrate (not shown) by means of an epitaxial growth method. The substrate is removed after forming the support 100 and thus the semiconductor layer 15 does not include the substrate on the first side 15a. The semiconductor layer 15 is not supported by a rigid sheet-like substrate but supported by the support 100 formed of a combination of the metal pillars 23 and 24, with the resin layer 25.

As a material of the p-side wire portion 41 and the n-side wire portion 43, it is possible to use, for example, copper, gold, nickel, silver, or the like. Among them, when the copper is used, it is possible to obtain the preferable thermal conductivity, high migration resistance, and an excellent adhesive property with respect to an insulating material.

The resin layer 25 causes the p-side metal pillar 23 and the n-side metal pillar 24 to be reinforced. As the resin layer 25, it a resin layer which has coefficient of thermal expansion close to or the same as that of the mounting substrate 70 can be used. As the described resin layer 25, it is possible to use, for example, a resin which mainly includes an epoxy resin, a resin which mainly includes a silicone resin, and a resin which mainly includes a fluororesin.

In addition, a light shielding material (a light absorbing agent, a light reflection agent, a light scattering agent, or the like) is included in the resin of the resin layer 25 and the resin layer 25 may have a light shielding property with respect to the light emitted from the light emitting layer 13. With this configuration, it is possible to suppress a light leakage from the side surface of the support 100 and the mounted surface side.

The stress which is caused in the solder allowing the p-side external terminal 23a and the n-side external terminal 24a to be bonded to the pads 81 to 83 of the mounting substrate 70 is applied to the semiconductor layer 15 due to a thermal cycle after mounting the semiconductor light-emitting device 1 on the mounting substrate 70. The p-side metal pillar 23, the n-side metal pillar 24, and the resin layer 25 absorb and alleviate the aforementioned stress. Particularly, it is possible to improve the effect of alleviating the stress by using the resin layer 25 that is softer than the semiconductor layer 15 as a portion of the support 100.

The reflecting film 51 is separated from the p-side wire portion 41 and the n-side wire portion 43. Therefore, the stress applied to the p-side metal pillar 23 and the n-side metal pillar 24 at the time of mounting is not transferred to the reflecting film 51. Accordingly, it is possible to suppress the reflecting film 51 from being detached. In addition, it is possible to suppress the stress applied to the side surface 15c side of the semiconductor layer 15.

The substrate used in forming the semiconductor layer 15 is removed from the semiconductor layer 15. For this reason, the height of the semiconductor light-emitting device 1 is decreased. Further, it is possible to form a fine roughness on the first side 15a of the semiconductor layer 15 by removing the substrate, thereby improving light extraction efficiency.

For example, with respect to the first side 15a, the fine roughness is formed by performing a wet etching with an alkali based solution. Thus, it is possible to improve the light extraction efficiency by reducing total reflection components on the first side 15a.

After removing the substrate, the phosphor layer 30 is formed on the first side 15a on an insulating film 19. The insulating film 19 causes the semiconductor layer 15 and the phosphor layer 30 to have the high adhesive property and is, for example, a silicone oxide film or a silicon nitride film.

The phosphor layer 30 has a structure in which a plurality of particulate phosphors 31 are scattered in the binding material 32. For example, a silicone resin may be used as the binding material 32.

The phosphor layer 30 is formed on the outer peripheral portion of the chip of the side surface 15c of the semiconductor layer 15 and formed on the area between the light-emitting elements 10 as well. In the outer peripheral portion of the chip and the area between the light-emitting elements 10, the phosphor layer 30 is provided on the insulating film (for example, the silicone oxide film) 18.

Figure 13:
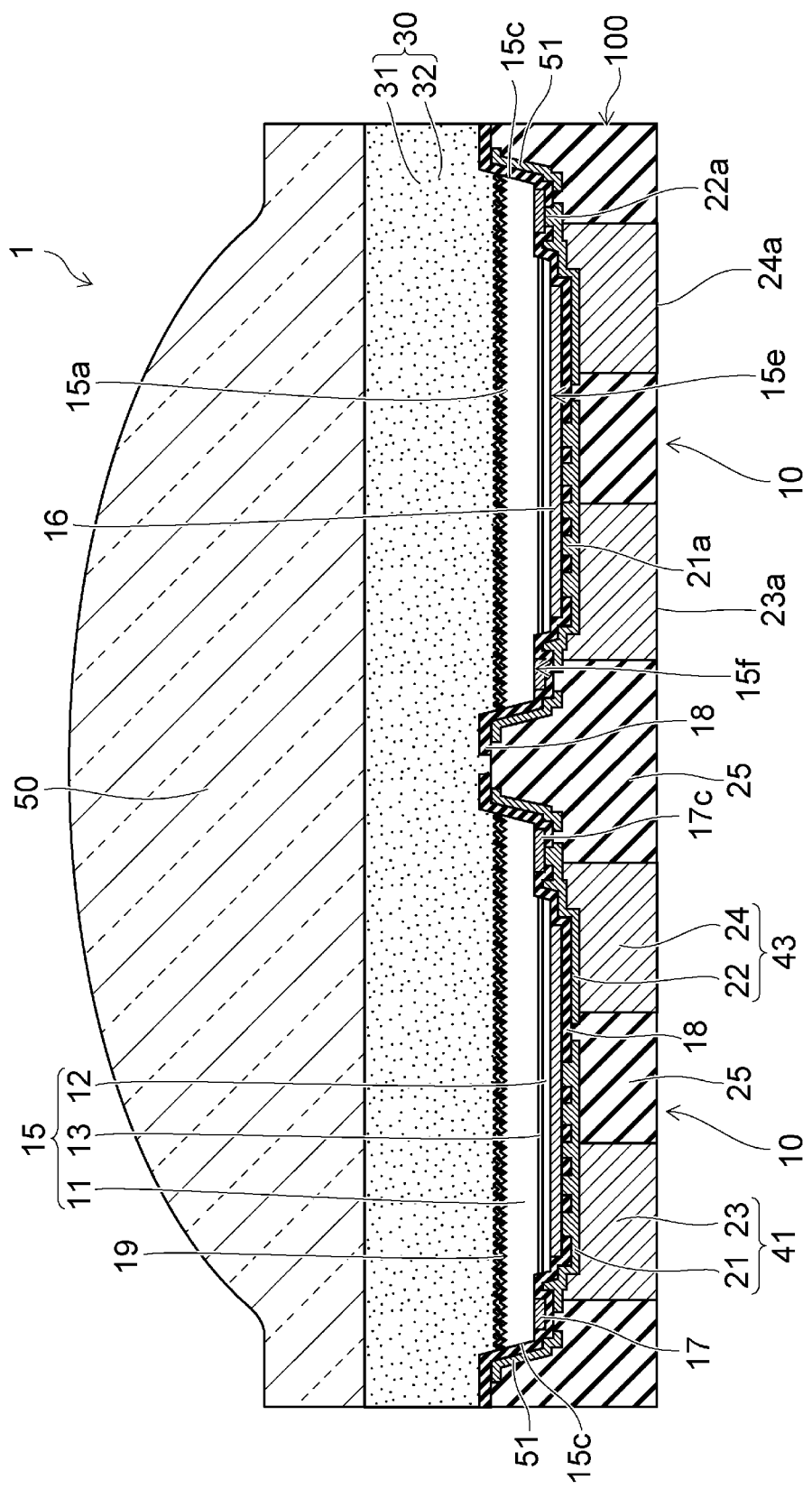
FIG. 13 is a cross-sectional view schematically illustrating a semiconductor light-emitting device according to a sixth embodiment.

In the area between separate semiconductor layers 15 (the area between chips), the insulating film 18 is not limited to be consecutively disposed, but may be divided into several portions as illustrated in FIG. 13. There may be a case where the cracks occur in the insulating film 18 depending on the thermal expansion coefficient of the resin layer 25, but as illustrated in FIG. 13, it is possible to suppress the cracks by dividing the insulating film 18 into several portions in the area between the chips by means of a patterning method.

The phosphor layer 30 is limited to be provided on the upper side of the area from the light-emitting element 10 and is not formed to surround the second side 15b of the semiconductor layer 15, the periphery of the metal pillars 23 and 24, and the side surface of the support 100. The side surface of the phosphor layer 30 is flush with the side surface of the support 100 (the side surface of the resin layer 25).

The phosphor layer 30 is not wastefully formed on the mounted surface side on which the light is not extracted to the outside, and thus it is possible to reduce the manufacturing cost. In addition, it is possible to dissipate the heat generated from the light emitting layer 13 to the mounting substrate 70 side via the p-side wire layer 21 and the n-side wire layer 22 which extend over the second side without including the substrate in the first side 15a, thereby obtaining the excellent heat radiation property even with a compact size.

In a general mounting of the flip chip, a phosphor layer is formed so as to cover the entire chip after mounting an LED chip on the mounting substrate via a bump or the like. Alternatively, a space between bumps is subject to underfilling with the resin.

In contrast, according to the embodiment, the resin layer 25 which is different from the phosphor layer 30 is provided at the periphery of the p-side metal pillar 23 and the periphery of the n-side metal pillar 24 in a state before mounting, and thus it is possible to impart a property suitable for alleviating the stress generated to the mounted surface side. In addition, since the resin layer 25 has been already provided on the mounted surface side, the underfilling after mounting is not necessary.

A layer is provided on the first side 15a, which is designed while prioritizing the light extraction efficiency, color conversion efficiency, light distribution property, or the like, and a layer is provided on the mounted surface side, which is designed while prioritizing the alleviation of the stress generated at the time of mounting or the property as the support taking the place of the substrate. For example, the resin layer 25 has a structure in which a base resin is filled with filler such as a silica particle at a high density and is adjusted to have the proper hardness as the support.

The light radiated from the light emitting layer 13 to the first side 15a is incident on the phosphor layer 30 and a portion of the light causes the phosphor 31 to be excited, and thus it is possible to obtain, for example, white light as a mixed light which is obtained by combining the light from the light emitting layer 13 with the light of the phosphor 31.

Here, if there is the substrate on the first side 15a, a portion of the light is not incident on the phosphor layer 30 and thus the light comes through the outside from the side surface of the substrate. In other words, the leakage of the light having a high color tone of the light from the light emitting layer 13 from the side surface of the substrate may cause color breakup or color unevenness, for example, a ring of the blue colored light appears on outer edge side when viewed from the top surface of the phosphor layer 30.

In contrast, according to the present embodiment, since there is no substrate which is used for the growth of the semiconductor layer 15 between the first side 15a and the phosphor layer 30, it is possible to prevent the color breakup or the color unevenness caused by the leakage of the light having the high color tone of the light from the light emitting layer 13 from the side surface of the substrate.

Further, according to the present embodiment, the reflecting film 51 is provided on the side surface 15c of the semiconductor layer 15 via the insulating film 18. The light directed to the side surface 15c of the semiconductor layer 15 from the light emitting layer 13 is reflected from the reflecting film 51, and thus does not come through the outside. For this reason, in conjunction with the fact that the substrate is not present in the first side 15a, it is possible to prevent the color breakup or the color unevenness caused by the leakage of the light from the side surface side of the semiconductor light-emitting device.

The insulating film 18 which is provided between the reflecting film 51 and the side surface 15c of the semiconductor layer 15 prevents the metal contained in the reflecting film from being diffused into the semiconductor layer 15. Therefore, it is possible to prevent, for example, GaN metallic contamination of the semiconductor layer 15 from being generated and prevent the semiconductor layer 15 from being deteriorated.

In addition, the insulating film 18, which is provided between the reflecting film 51 and the phosphor layer 30, and between the resin layer 25 and the phosphor layer 30, promotes adhesion between the reflecting film 51 and the phosphor layer 30 and promotes adhesion between the resin layer 25 and the phosphor layer 30.

The insulating film 18 is, for example, an inorganic insulating film such as a silicon oxide film or a silicon nitride film. In other words, the first side 15a of the semiconductor layer 15, the second side 15b, the side surface 15c of the first semiconductor layer 11, the side surface of the second semiconductor layer 12, and the side surface of the light emitting layer 13 are covered with an inorganic insulating film. The inorganic insulating film surrounds the semiconductor layer 15 so as to block the semiconductor layer 15 from the metal, moisture, or the like.

The phosphor layer 30 extends over the plurality of light-emitting elements 10. A lens 50 is provided on the phosphor layer 30 as necessary. The lens 50 is formed of, for example, the transparent resin. FIG. 3 illustrates an example of a convex lens, but a concave lens may also be illustrated as an example.

The plurality of light-emitting elements 10 are commonly packaged with the resin layer 25. For that reason, it is possible to integrally form the lens so as to cover the plurality of light-emitting elements 10. According to the multi-chip package of the embodiment, it is possible to control the light distribution property with a lens shape which is not capable to be controlled when forming the lens on an individual package which is separated for each of the light-emitting elements.

A process of forming the light-emitting element 10, the support 100, the phosphor layer 30, and the lens 50 is performed in a wafer state of including the plurality of semiconductor layers 15. Thereafter, the wafer is divided into a plurality of semiconductor light-emitting devices 1 including at least two light-emitting elements 10 that each include the semiconductor layer 15. The cutting is performed in an area (a dicing area) between adjacent semiconductor layers 15. By optionally selecting the dicing area, it is possible to select the number of the light-emitting elements 10 (the semiconductor layer 10) included in one semiconductor light-emitting device.

The respective processes until dicing are performed at once in a wafer state, and thus it is not necessary to form the wire layers, pillars, and phosphor layers, and to perform packaging through using the resin layer for each of the separated semiconductor light-emitting devices, thereby remarkably reducing the manufacturing cost.

Since the support 100 and the phosphor layer 30 are formed and then the cutting of them is performed in the wafer state, the side surface of the phosphor layer 30 is flush with the side surface of the support 100 (the side surface of the resin layer 25) to form the side surface of the separated semiconductor light-emitting devices 1. Accordingly, there is no substrate and thus it is possible to provide the semiconductor light-emitting device in a compact size.

According to the present embodiment, the optical layer (e.g., the phosphor layer 30) is provided on the first side 15a of the semiconductor layer 15. The light-emitting element 10 including the semiconductor layer 15, the p-side electrode 16, and the n-side electrode 17 is provided between the optical layer and the mounted surface (the surface on which the external terminals 23a and 24a are provided).

The optical layer may be a scattering layer without being limited to the phosphor layer 30. The scattering layer includes a plurality of particulate scattering materials (for example, a titanium compound) which scatter the radiated light from the light emitting layer 13 and a binding material (for example, the resin layer) which holds the plurality of scattering materials and transmits the radiated light from the light emitting layer 13.

The aforementioned semiconductor light-emitting device 1 is mounted on the mounting substrate 70 as illustrated in FIG. 2A. The mounting substrate 70 includes a first pad 81, a second pad 82, and a third pad 83. The first pad 81, the second pad 82, and the third pad 83 are formed of metal (for example, copper). The first pad 81, the second pad 82, and the third pad 83 are formed on an insulated body. The periphery of each of the first pad 81, the second pad 82, and the third pad 83 are each surrounded by the insulated body.

The first pad 81, the second pad 82, and the third pad 83 are in a line so as to be separated from each other in the first direction X. The third pad 83 is provided between the first pad 81 and the second pad 82.

The first pad 81 and the p-side external terminal 23a can have congruent shapes and the second pad 82 and the n-side external terminal 24a can have congruent shapes which differ from the respective congruent shapes of the first pad 81 and the p-side external terminal 23a.

The first pad 81 is formed in a rectangular shape which has the long sides extending in the second direction Y orthogonal to the first direction X. The second pad 82 is formed in a shape in which two corners of the rectangle having the same size as the rectangle of the first pad 81 are cut off or clipped. Therefore, it is possible to determine the intended polarity of the pads.

Meanwhile, if the n-side external terminal 24a is formed in the rectangle shape and the p-side external terminal 23a is formed in the rectangle shape having corners clipped, it is possible to form the second pad 82 in the rectangle shape and form the first pad 81 in the rectangle shape having the corners clipped.

The third pad 83 is formed, for example, in a square shape. An area of the third pad 83 is larger than an area of the first pad 81 and an area of the second pad 82. The first pad 81 and the second pad 82 are symmetrically disposed with respect to a center line C which is used for dividing the third pad 83 into two portions in the first direction X.

As illustrated in FIG. 2B, in the semiconductor light-emitting device 1, two light-emitting elements 10 are disposed in the first direction X. Each of the light-emitting elements 10 includes one p-side external terminal 23a and one n-side external terminal 24a. In one light-emitting element 10, the p-side external terminal 23a and the n-side external terminal 24a are disposed in the first direction X.

Accordingly, four external terminals 23a and 24a of the two light-emitting elements 10 are disposed in the first direction X. The p-side external terminal 23a and the n-side external terminal 24a are alternately disposed in the first direction X.

In FIG. 2B, the p-side external terminal 23a of the light-emitting element 10 on the left side is connected to the p-side electrode 16 of the light-emitting element 10 on the left side and the n-side external terminal 24a of the light-emitting element 10 on the left side is connected to the n-side electrode 17 of the light-emitting element 10 on the left side.

In FIG. 2B, the p-side external terminal 23a of the light-emitting element 10 on the right side is connected to the p-side electrode 16 of the light-emitting element 10 on the right side and the n-side external terminal 24a of the light-emitting element 10 on the right side is connected to the n-side electrode 17 of the light-emitting element 10 on the right side.

Among the four external terminals 23a and 24a which are disposed in the first direction X, the p-side external terminal 23a at one end in the first direction X is bonded to the first pad 81 of the mounting substrate 70 via, for example, the solder. That is, in FIG. 2B, the p-side external terminal 23a of the light-emitting element 10 on the left side is bonded to the first pad 81.

Among the four external terminals 23a and 24a, the n-side external terminal 24a at the other end in the first direction X is bonded to the second pad 82 of the mounting substrate 70 via, for example, the solder. That is, in FIG. 2B, the n-side external terminal 24a of the light-emitting element 10 on the right side is bonded to the second pad 82.

Two external terminals 23a and 24a between the p-side external terminal 23a at a left end (which is bonded to the first pad 81) and the n-side external terminal 24a at a right end (which is bonded to the second pad 82) are each bonded to the third pad 83 of the mounting substrate 70 via the solder. That is, two external terminals 23a and 24a are commonly bonded to the third pad 83.

Therefore, among the two light-emitting elements 10 adjacent in the first direction X, the n-side external terminal 24a of one light-emitting element 10 (on the left side in FIG. 2B) and the p-side external terminal 23a of the other light-emitting element 10 (on the right side in FIG. 2B) are commonly bonded to the third pad 83.

An anode electric potential is applied to the first pad 81 via a wire (not illustrated) which is formed on the mounting substrate 70. A cathode electric potential having a value lower than that of the anode electric potential is applied to the second pad 82 via another wire (not illustrated) which is formed on the mounting substrate 70.

The third pad 83 is not electrically connected to any external wire and thus the potential thereof is a floating potential. The n-side external terminal 24a of the one light-emitting element 10 (on the left side) and the p-side external terminal 23a of the other light-emitting element 10 (on the right side) are electrically connected to each other via the third pad 83.

The electric current is supplied to the light emitting layer 13 via the first pad 81, the p-side external terminal 23a at the left end which is bonded to the first pad 81, the p-side metal pillar 23 of the light-emitting element 10 on the left side, the p-side wire layer 21, the p-side electrode 16, and the second semiconductor layer 12, thus, electric current flows in the first semiconductor layer 11 of the light-emitting element 10 on the left side, the n-side electrode 17, the n-side wire layer 22, the n-side metal pillar 24, and the n-side external terminal 24a.

In addition, the electric current is supplied to the light emitting layer 13 of the light-emitting element 10 on the right side via the third pad 83, the p-side external terminal 23a of the light-emitting element 10 on the right side, the p-side metal pillar 23, the p-side wire layer 21, the p-side electrode 16, and the second semiconductor layer 12, and thus electric current flows in the first semiconductor layer 11 of the light-emitting element 10 on the right side, the n-side electrode 17, the n-side wire layer 22, the n-side metal pillar 24, the n-side external terminal 24a, and the second pad 82 to which the n-side external terminal 24a is bonded.

In other words, as schematically illustrated by the diode circuit symbols in FIG. 1, the two light-emitting elements 10 are connected between the first pad 81 and the second pad 82 in series.

The two light-emitting elements 10 are electrically connected to each other via the third pad 83 which is formed on the mounting substrate 70. It is not necessary to connect the two light-emitting elements 10 to each other using a wire layer (or bonding wire) inside the package and thus it is possible to provide a simplified multi-chip package.

As depicted in FIG. 1, the area of the third pad 83 is larger than each of the area of the first pad 81 and the area of the second pad 82. In addition, the area of the third pad 83 may be larger than the combined area of the first pad 81 and the second pad 82. Furthermore, the area of the third pad 83 is larger than the combined area of one p-side external terminal 23a with the area of one n-side external terminal 24a. Thus, it is possible to efficiently dissipate heat generated in the semiconductor light-emitting device 1 to the mounting substrate 70 side via such a wide third pad 83.

The distance between the first pad 81 and the third pad 83, that is, the distance between the p-side external terminal 23a of the light-emitting element 10 on the left side in FIG. 2B and the n-side external terminal 24a is about 200 µm or greater in order to limit the occurrence of a short circuit caused by the solder or conductive mounting material used to bond the light-emitting elements 10 to the pads 81, 82, and 83. In the same manner, the distance between the second pad 82 and the third pad 83, that is, the distance between the p-side external terminal 23a of the light-emitting element 10 on the right side in FIG. 2B and the n-side external terminal 24a is about 200 µm or greater for the same reason.

In contrast, since the n-side external terminal 24a of the one light-emitting element 10 (on the left side) and the p-side external terminal 23a of the other light-emitting element 10 (on the right side) are commonly bonded to the third pad 83, the distance between the external terminals 23a and 24a adjacent to each other of the light-emitting elements 10 adjacent to each other is not restricted, thereby obtaining high design freedom.

Typically, if two semiconductor light-emitting devices having a single chip structure in which one light-emitting element is included in one package are placed adjacent to each other and then mounted on the mounting substrate, it is necessary to have a clearance between the two semiconductor light-emitting devices to be mounted that is sufficient for a collet for holding the semiconductor light-emitting devices does not collide with the adjacent semiconductor light-emitting device. Consequently, even when the package size of the individual semiconductor light-emitting device is reduced for typical designs, a mounting space between devices is still restricted by the minimum size of the collet available.

In contrast, according to the present embodiment, since the plurality of light-emitting elements 10 may be brought close to each other in one package, it is possible to reduce the required mounting spacing distance on the mounting substrate compared to a case of mounting singulated plurality of light-emitting elements.

Figure 6:
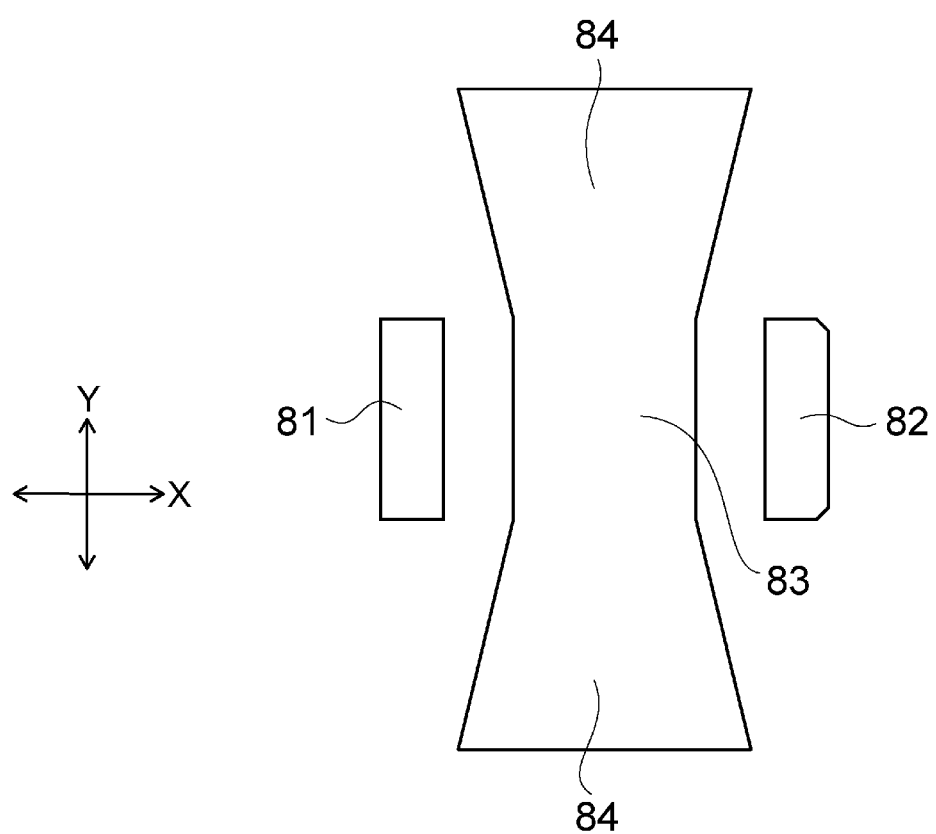
FIG. 6 is a plan view schematically illustrating a mounting substrate according to a second embodiment.

FIG. 6 is a plan view schematically illustrating another example of the pads of the mounting substrate.

According to FIG. 6, a fourth pad 84 is integrally provided with the third pad 83 and a heat dissipation area for the embodiment of FIG. 6 becomes larger than the embodiment illustrated in FIG. 2A. The fourth pad 84 extends in the second direction Y from the third pad 83 so as to avoid the first pad 81 and the second pad 82.

Figure 7:
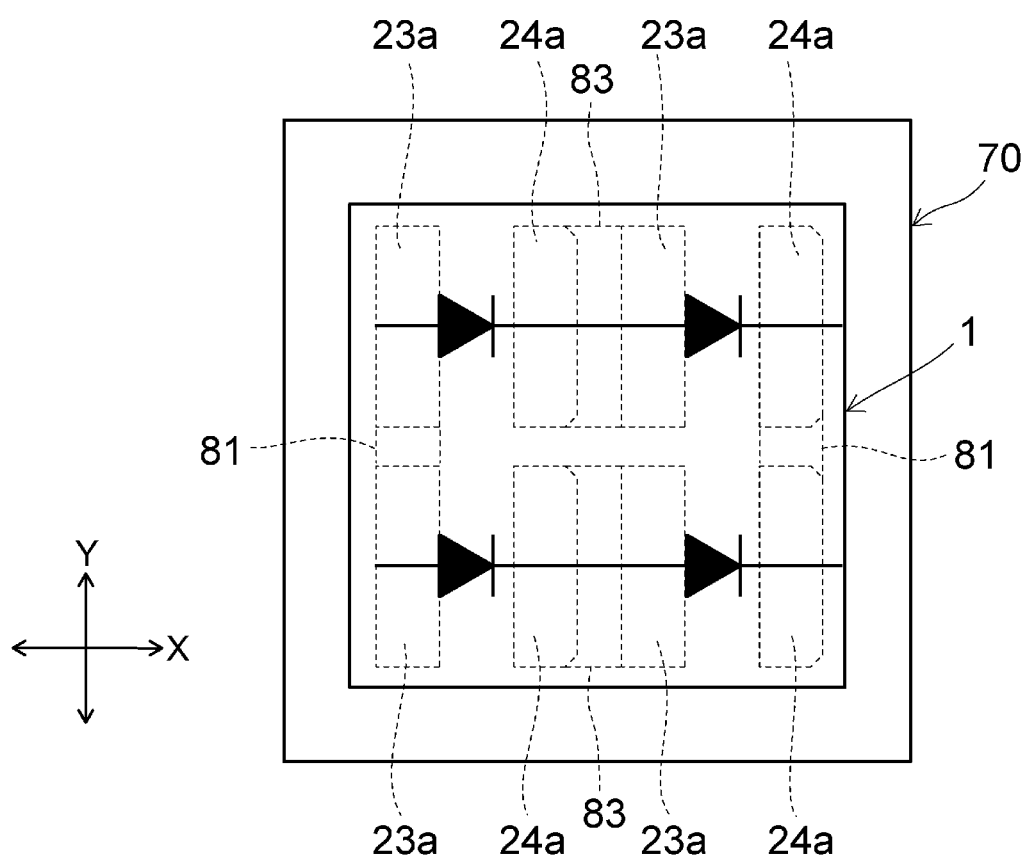
FIG. 7 is a plan view schematically illustrating a light-emitting unit according to a third embodiment.

FIG. 7 is a plan view schematically illustrating a light-emitting unit according to a second embodiment.

Figure 8A:
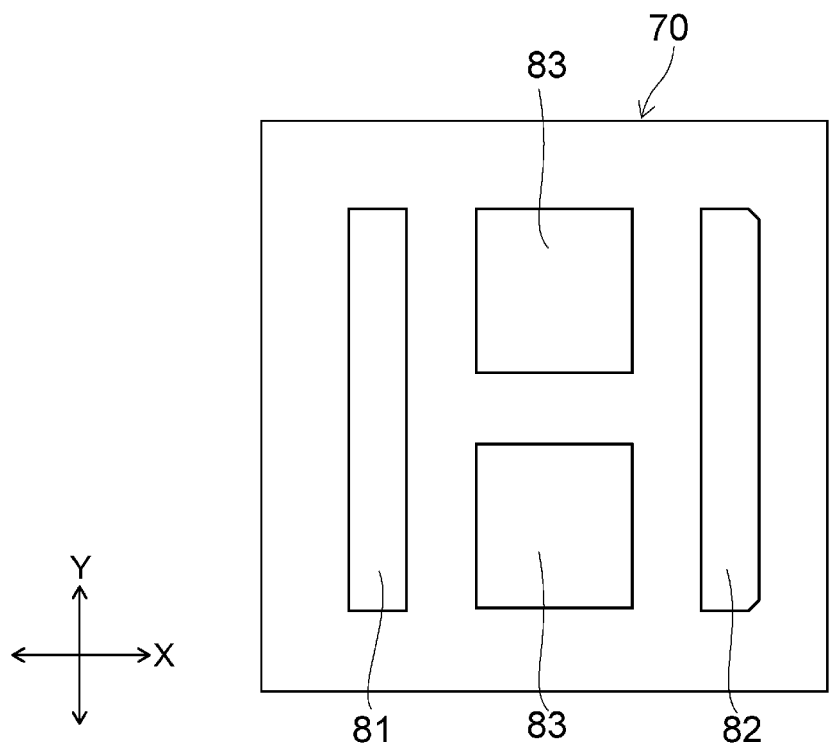
FIG. 8A is a plan view schematically illustrating a mounting substrate according to the third embodiment.

FIG. 8A is a plan view schematically illustrating a mounting substrate 70 according to the second embodiment.

Figure 8B:
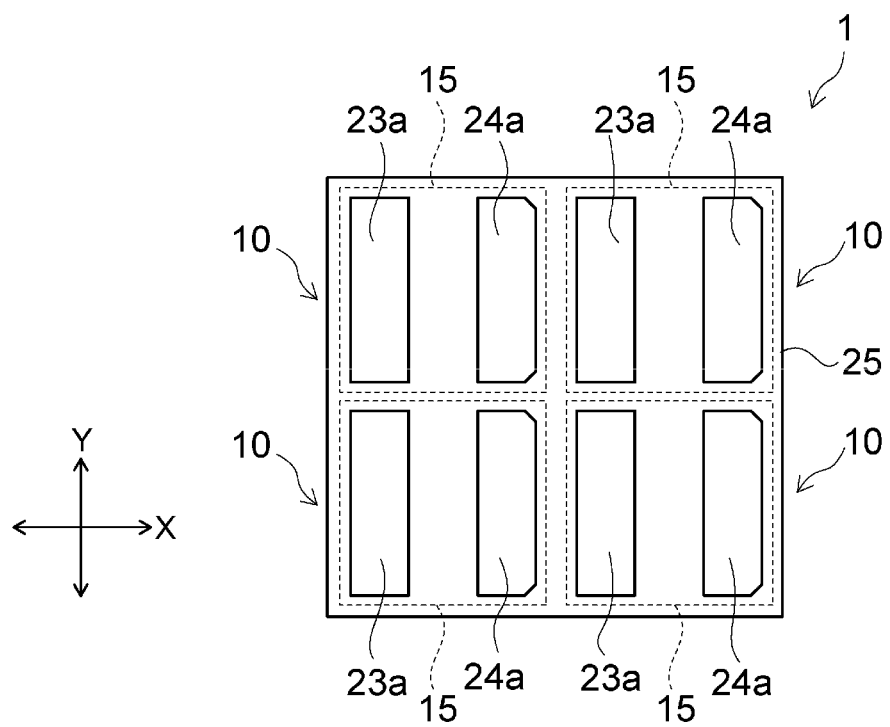
FIG. 8B is a plan view schematically illustrating a semiconductor light-emitting device according to the third embodiment.

FIG. 8B is a plan view schematically illustrating a semiconductor light-emitting device 1 according to the second embodiment.

FIG. 7, FIG. 8A, and FIG. 8B respectively correspond, in general, to FIG. 1, FIG. 2A, and FIG. 2B and thus like reference numerals are given to portions like those in the drawings.

The semiconductor light-emitting device 1 as illustrated in FIG. 8B includes, for example, four light-emitting elements 10. The four light-emitting elements 10 are packaged using the resin layer 25 at the wafer level and the resin layer 25 integrally supports the four light-emitting elements 10.

A group (row) of two light-emitting elements 10 disposed in the first direction X is separated from another group (row) of two light-emitting elements disposed in the first direction X. The two groups (rows) are separated in the second direction Y orthogonal to the first direction X.

In the group (row) of the two light-emitting elements 10 disposed in the first direction X, the p-side external terminal 23a and the n-side external terminal 24a are alternately disposed in the first direction X.

One first pad 81, one second pad 82, and two third pads 83 are formed on the mounting substrate 70.

The two third pads 83 are disposed between the first pad 81 and the second pad 82 by being separated from each other in the second direction Y.

Among the four external terminals 23a and 24a which are disposed in a row in the first direction X, the p-side external terminal 23a at one end in the first direction X is bonded to the first pad 81 of the mounting substrate 70 via, for example, the solder. In other words, the two p-side external terminals 23a of the two light-emitting elements 10 on the left side in FIG. 8B are bonded to the first pad 81.

Among the four external terminals 23a and 24a which are disposed in a row in the first direction X, the n-side external terminal 24a at the other end in the first direction X is bonded to the second pad 82 of the mounting substrate 70 via, for example, the solder. In other words, the two n-side external terminals 24a of the two light-emitting elements 10 on the right side in FIG. 8B are bonded to the second pad 82.

The external terminals 23a and 24a, between the p-side external terminal 23a at the left end which is bonded to the first pad 81 and the n-side external terminal 24a at the right end which is bonded to the second pad 82, are bonded to the third pad 83 of the mounting substrate 70 via the solder.

Among two light-emitting elements 10 which are adjacent to each other in a row on the upper side in the first direction X in FIG. 8B, the n-side external terminal 24a of the one light-emitting element 10 (on the left side) and the p-side external terminal 23a of the other light-emitting element 10 (on the right side) are bonded to one of the two third pads 83.

Among two light-emitting elements 10, the n-side external terminal 24a of the one light-emitting element 10 (on the left side) and the p-side external terminal 23a of the other light-emitting element 10 (on the right side), which are adjacent to each other in a row on the lower side in the first direction X in FIG. 8B, are bonded to the other of the two third pads 83.

The anode electric potential is applied to the first pad 81 via a wire (not shown) which is formed on the mounting substrate 70. The cathode electric potential having a value lower than that of the anode electric potential is applied to the second pad 82 via another wire (not illustrated) which is formed on the mounting substrate 70.

The third pad 83 is not electrically connected to any external wire and thus the potential thereof becomes a floating potential. The n-side external terminal 24a of the one light-emitting element 10 (on the left side) and the p-side external terminal 23a of the other light-emitting element 10 (on the right side), which are adjacent to each other in the first direction X, are electrically connected to each other via the third pad 83.

Accordingly, as schematically illustrated by the circuit symbol of the diode in FIG. 7, the two light-emitting elements 10 which are disposed in the first direction X are connected between the first pad 81 and the second pad 82 in series. In addition, an upper side row and a lower side row are connected between the first pad 81 and the second pad 82 in parallel.

Since the n-side external terminal 24a of the one light-emitting element 10 (on the left side) and the p-side external terminal 23a of the other light-emitting element 10 (on the right side), which are adjacent to each other in the first direction X, are commonly bonded to the third pad 83, and the distance between the external terminals 23a and 24a adjacent to each other of the light-emitting elements 10 adjacent to each other is not restricted, thereby obtaining high design freedom.

In addition, since the plurality of light-emitting elements 10 may be brought close to each other in one package, it is possible to reduce the mounting space on the mounting substrate compared to a case of mounting the singulated plurality of light-emitting elements.

Figure 9:
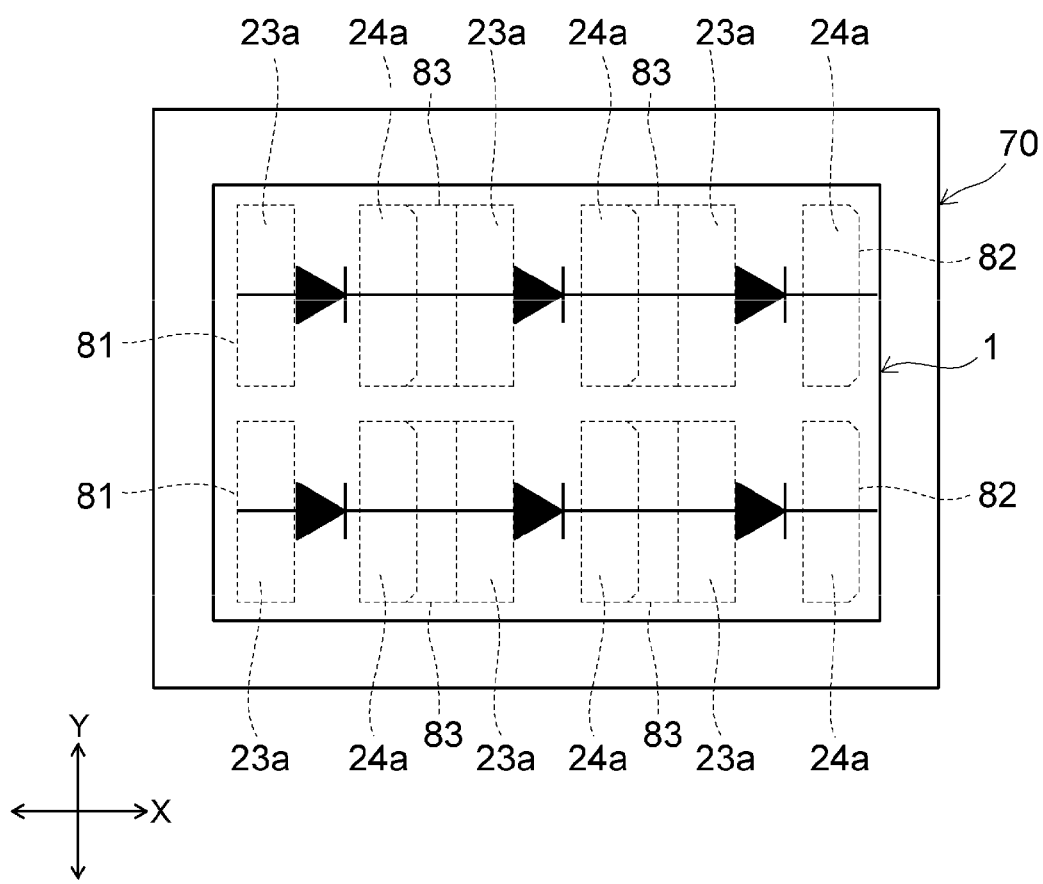
FIG. 9 is a plan view schematically illustrating a light-emitting unit according to a fourth embodiment.

FIG. 9 is a plan view schematically illustrating a light-emitting unit according to still another embodiment.

Figure 10A:
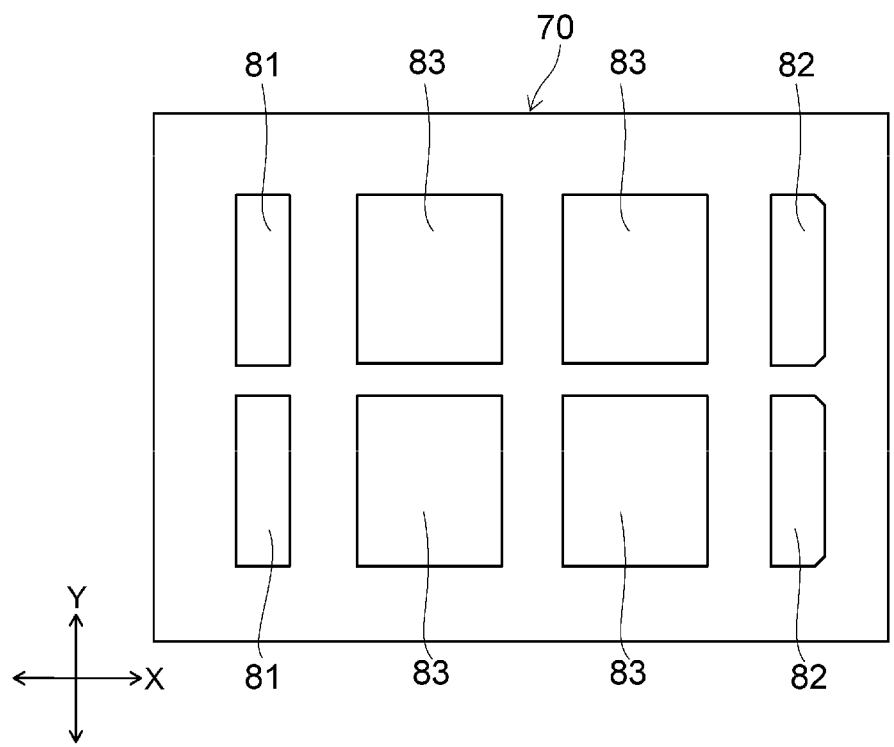
FIG. 10A is a plan view schematically illustrating a mounting substrate in the fourth embodiment.

FIG. 10A is a plan view schematically illustrating a mounting substrate 70 according to still another embodiment.

Figure 10B:
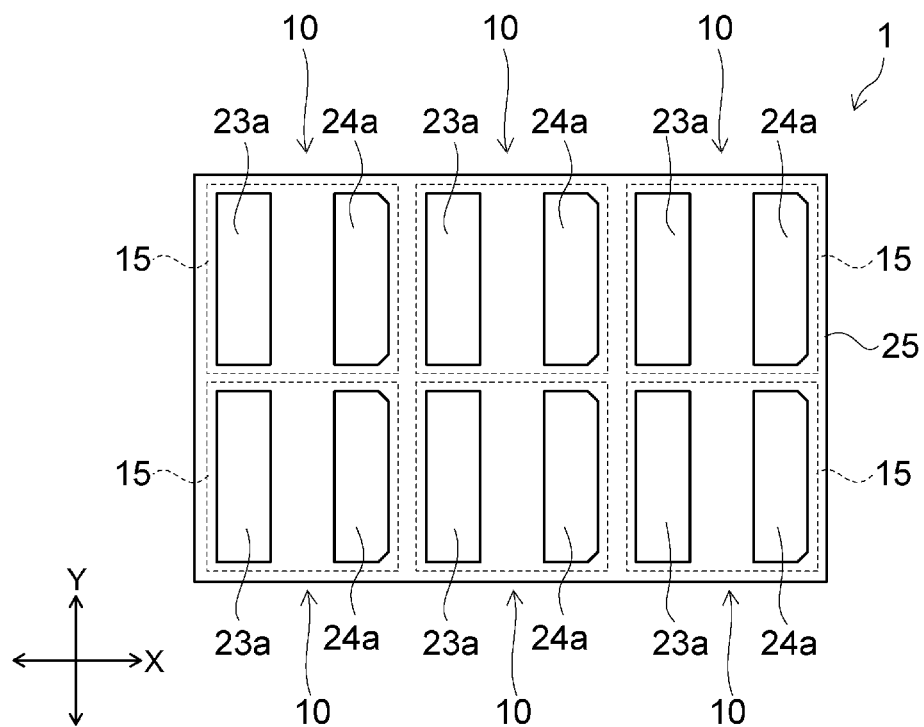
FIG. 10B is a plan view schematically illustrating a semiconductor light-emitting device according to the fourth embodiment.

FIG. 10B is a plan view schematically illustrating a semiconductor light-emitting device 1 according to still another embodiment.

FIG. 9, FIG. 10A, and FIG. 10B respectively correspond to FIG. 7, FIG. 8A, and FIG. 8B and thus like reference numerals are given to portions like those in the drawings.

The semiconductor light-emitting device 1 as illustrated in FIG. 10B includes, for example, six light-emitting elements 10. The six light-emitting elements 10 are packaged by the resin layer 25 at a wafer level and the resin layer 25 integrally supports the six light-emitting elements 10.

Three light-emitting elements 10 are disposed in the first direction X. A group (a row) of three light-emitting elements 10 disposed in the first direction X is separated from another group (row) of three light-emitting elements disposed in the first direction X. The two groups (rows) are separated in the second direction Y orthogonal to the first direction X.

In the group (the row) of the three light-emitting elements 10 disposed in the first direction X, the p-side external terminal 23a and the n-side external terminal 24a are alternately disposed in the first direction X.

Two first pads 81, two second pads 82, and four third pads 83 are formed on the mounting substrate 70.

The two first pads 81 are disposed by being separated from each other in the second direction Y. The two second pads 82 are disposed by being separated from each other in the second direction Y. Alternatively, as illustrated in FIG. 8A, a configuration that one first pad 81 extends in the second direction Y and one second pad 82 extends in the second direction Y may be employed. In this case, an area of the pad becomes larger and thus the heat radiation property is improved.

Two rows of two third pads 83 disposed in the first direction X are provided. That is, a total of four third pads 83 are provided between the first pads 81 and the second pads 82.

Among the six external terminals 23a and 24a of the three light-emitting elements 10 which are disposed in a row in the first direction X, the p-side external terminal 23a at one end in the first direction X is bonded to the first pad 81 of the mounting substrate 70 via, for example, the solder. In other words, the two p-side external terminals 23a of the two light-emitting elements 10 at a left end which are separated in the second direction Y in FIG. 10B are each bonded to one of the first pads 81.

Among the six external terminals 23a and 24a which are disposed in a row in the first direction X, the n-side external terminal 24a at the other end in the first direction X is bonded to the second pad 82 of the mounting substrate 70 via, for example, the solder. In other words, the two n-side external terminals 24a of the two light-emitting elements 10 at a right end which are separated in the second direction Y in FIG. 10B are each bonded to one of the second pads 82.

The external terminals 23a and 24a, between the p-side external terminal 23a at the left end which is bonded to the first pad 81 and the n-side external terminal 24a at the right end which is bonded to the second pad 82, are bonded to one of the third pads 83 of the mounting substrate 70 via the solder.

Among the two light-emitting elements 10 which are at the left end in a row on the upper side in FIG. 10B, the n-side external terminal 24a of the one light-emitting element 10 (on the left side) and the p-side external terminal 23a of the other light-emitting element 10 (on the right side), are bonded to one of the two third pads 83 which are adjacent to the first pad 81 as illustrated in FIG. 10A.

Among the two light-emitting elements 10 which are at the left end in a row on the lower side in FIG. 10B, the n-side external terminal 24a of the one light-emitting element 10 (on the left side) and the p-side external terminal 23a of the other light-emitting element 10 (on the right side), are bonded to the other of two third pads 83 which are adjacent to the first pad 81 as illustrated in FIG. 10A.

Among the two light-emitting elements 10 which are at the right end in a row on the upper side in FIG. 10B, the n-side external terminal 24a of the one light-emitting element 10 (on the left side) and the p-side external terminal 23a of the other light-emitting element 10 (on the right side), are bonded to the one of the two third pads 83 which are adjacent to the second pad 82 as illustrated in FIG. 10A.

Among the two light-emitting elements 10 which are at the right end in a row on the lower side in FIG. 10B, the n-side external terminal 24a of the one light-emitting element 10 (on the left side) and the p-side external terminal 23a of the other light-emitting element 10 (on the right side), are bonded to the other of the two third pads 83 which are adjacent to the second pad 82 as illustrated in FIG. 10A.

The anode electric potential is applied to the first pad 81 via a wire (not illustrated) which is formed on the mounting substrate 70. The cathode electric potential having a value lower than that of the anode electric potential is applied to the second pad 82 via another wire (not illustrated) which is formed on the mounting substrate 70.

The third pads 83 are not electrically connected to any external wire and thus the potential thereof becomes a floating potential. For each third pad 83, the n-side external terminal 24a (p-side external terminal 23a) of one light-emitting element 10 and the p-side external terminal 23a (n-side external terminal 24a) of another light-emitting element 10, among two light-emitting elements 10 which are adjacent to each other in the first direction X, are electrically connected to each other via the third pad 83.

Accordingly, as schematically illustrated by the circuit symbol of the diode in FIG. 9, three light-emitting elements 10 which are disposed in the first direction X are connected between the first pad 81 and the second pad 82 in series.

Since the n-side external terminal 24a (the p-side external terminal 23a) of the one light-emitting element 10 and the p-side external terminal 23a (the n-side external terminal 24a) of the other light-emitting element 10, which are adjacent to each other in the first direction X, are commonly bonded to the third pad 83, the distance between the external terminals 23a and 24a which are adjacent to each other of the light-emitting elements 10 adjacent to each other is not restricted, thereby obtaining high design freedom.

In addition, since the plurality of light-emitting elements 10 may be brought close to each other in one package, it is possible to reduce the mounting space on the mounting substrate compared to a case of mounting the singulated plurality of light-emitting elements.

Figure 11:
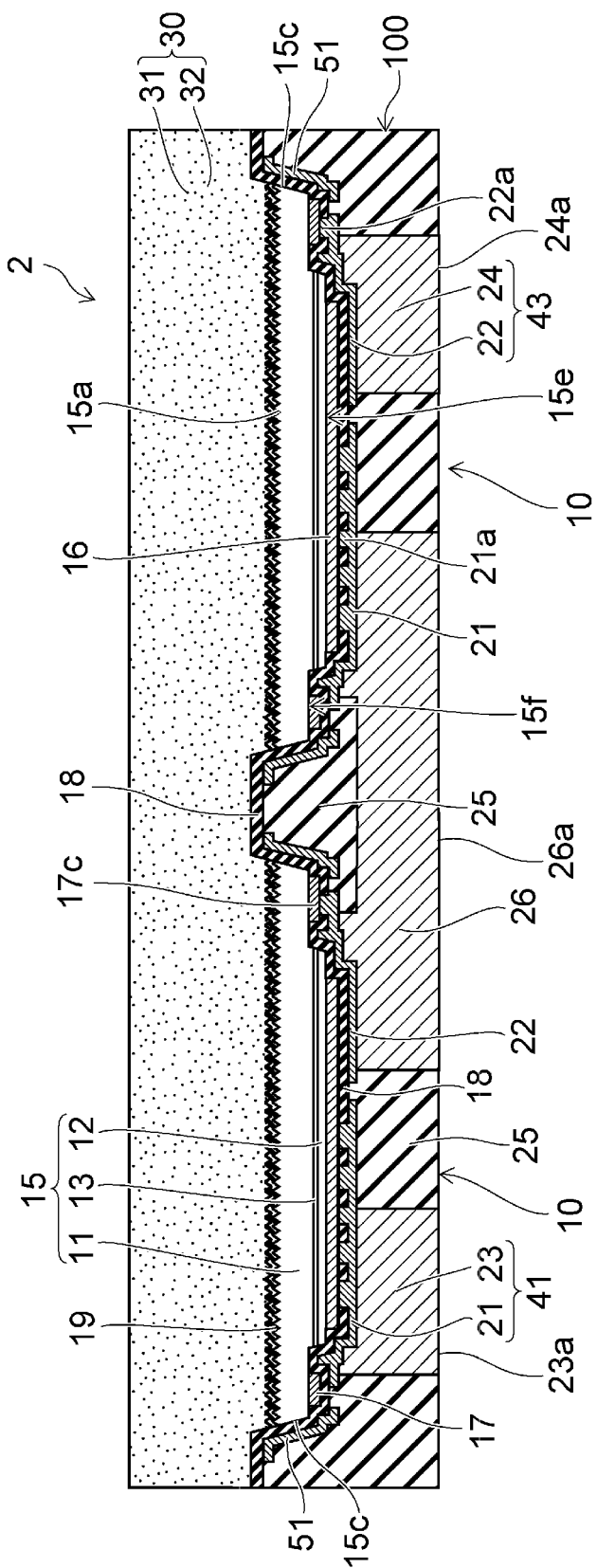
FIG. 11 is a cross-sectional view schematically illustrating a semiconductor light-emitting device according to a fifth embodiment.

FIG. 11 is a cross-sectional view schematically illustrating a semiconductor light-emitting device 2 according to another embodiment.

Figure 12:
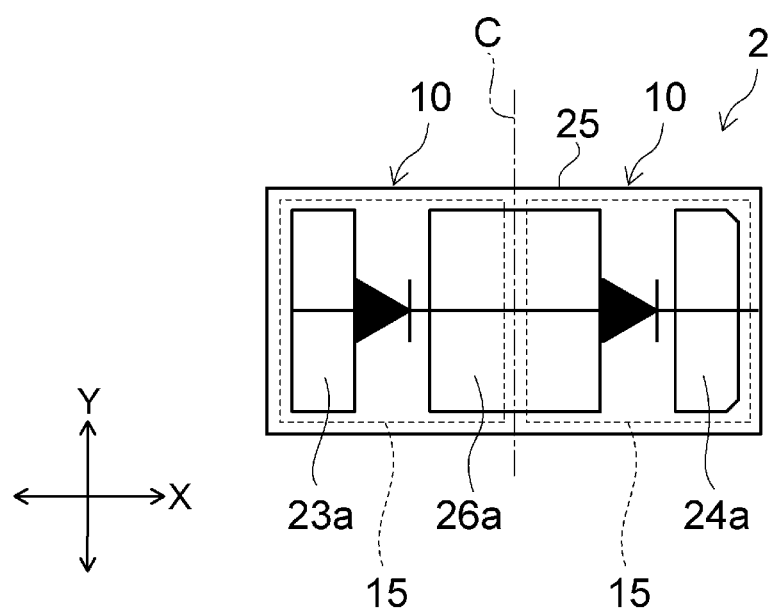
FIG. 12 is a plan view schematically illustrating a semiconductor light-emitting device according to the fifth embodiment.

FIG. 12 is a plan view schematically illustrating the semiconductor light-emitting device 2. FIG. 12 illustrates the mounted surface of the semiconductor light-emitting device 2 and corresponds to the bottom view of the semiconductor light-emitting device 2 as illustrated in FIG. 11.

Because the semiconductor light-emitting device 2 includes a third metal pillar 26 and a third external terminal 26a, the semiconductor light-emitting element 26 is differentiated from the semiconductor light-emitting device according to the above described embodiment. In the semiconductor light-emitting device 2, like reference numerals are given to portions like those of the semiconductor light-emitting device 1 and the detailed description thereof will not be repeated.

The semiconductor light-emitting device 2 includes a plurality of light-emitting elements 10. In examples illustrated in FIG. 11 and FIG. 12, the semiconductor light-emitting device 2 includes, for example, the two light-emitting elements 10. The plurality of light-emitting elements 10 are packaged through using a resin layer 25 at a wafer level and the resin layer 25 integrally supports the plurality of light-emitting elements 10.

An outer shape of the semiconductor light-emitting device 2 when viewed from the top surface or the mounted surface of the opposite side of the top surface is, for example, rectangular. For example, the two light-emitting elements 10 are disposed side by side in a longitudinal direction (in a first direction X) in the rectangle.

One light-emitting element 10 among the two light-emitting elements 10 which are adjacent to each other in the first direction X includes the p-side metal pillar 23 and the p-side external terminal 23a but does not include the n-side metal pillar 24 and the n-side external terminal 24a. The other light-emitting element 10, on the other hand, does not include the p-side metal pillar 23 and the p-side external terminal 23a but includes the n-side metal pillar 24 and the n-side external terminal 24a.

The third metal pillar 26 is commonly provided on the two light-emitting elements 10 adjacent in the first direction X. The third metal pillar 26 is formed of the same material as those of the p-side metal pillar 23 and the n-side metal pillar 24 in the same way (for example, electroplating method) at the same time.

The third metal pillar 26 is connected to the n-side wire layer 22 of one light-emitting element 10 and the p-side wire layer 21 of the other light-emitting element 10 among the two light-emitting elements 10 which are adjacent to each other in the first direction X.

The end portion (the bottom surface in FIG. 11) of the third metal pillar 26 is exposed from the resin layer 25 and functions as the third external terminal 26a.

As illustrated in FIG. 12, the two light-emitting elements 10 are disposed in the first direction X. The p-side external terminal 23a of the one light-emitting element 10 is provided at one end in the first direction X and the n-side external terminal 24a of the other light-emitting element 10 is provided at the other end in the first direction X. The third external terminal 26a is provided between the p-side external terminal 23a and the n-side external terminal 24a at both ends in the first direction X.

The third external terminal 26a is formed, for example, in a square shape. The exposed area of the third external terminal 26a is larger than the exposed area of the p-side external terminal 23a and the exposed area of the n-side external terminal 24a. The exposed area refers to the area of the terminal facing away from the light emitting element (i.e., the areas that can be bonded to one of the pads on the mounting substrates). In addition, the exposed area of the third external terminal 26a is larger than the area combining the exposed area of the p-side external terminal 23a with the exposed area of the n-side external terminal 24a. The p-side external terminal 23a and the n-side external terminal 24a are symmetrically disposed with respect to a center line C which is used for dividing the third external terminal 26a into two portions in the first direction X.

In FIG. 11 and FIG. 12, the p-side external terminal 23a of the light-emitting element 10 on the left side is connected to the p-side electrode 16 of the light-emitting element 10 on the left side and the n-side electrode 17 of the light-emitting element 10 on the left side is connected to the third external terminal 26a.

In FIG. 11 and FIG. 12, the n-side external terminal 24a of the light-emitting element 10 on the right side is connected to the n-side electrode 17 of the light-emitting element 10 on the right side and the p-side electrode 16 of the light-emitting element 10 on the right side is connected to the third external terminal 26a.

The semiconductor light-emitting device 2 as illustrated in FIG. 11 and FIG. 12 may be mounted on, for example, the mounting substrates illustrated in FIG. 2A.

The p-side external terminal 23a is bonded to the first pad 81 of the mounting substrate 70, for example, via solder. The n-side external terminal 24a is bonded to the second pad 82 of the mounting substrate 70, for example, via solder. The third external terminal 26a between the p-side external terminal 23a and the n-side external terminal 24a is bonded to the third pad 83 of the mounting substrate 70, for example, via solder.

The anode electric potential is applied to the first pad 81 via a wire (not illustrated) which is formed on the mounting substrate 70. The cathode electric potential having a value lower than that of the anode electric potential is applied to the second pad 82 via another wire (not illustrated) which is formed on the mounting substrate 70.

The third pad 83 is not electrically connected to any external wire and thus the potential thereof becomes a floating potential. The n-side electrode 17 of the one light-emitting element 10 (on the left side) and the p-side electrode 16 of the other light-emitting element 10 (on the right side) are electrically connected to each other via the third metal pillar 26, the third external terminal 26a, and the third pad 83.

The electric current is supplied to the light-emitting layer 13 via the first pad 81, the p-side external terminal 23a of the one light-emitting element 10 which is bonded to the first pad 81, the p-side metal pillar 23, the p-side wire layer 21, the p-side electrode 16, and the second semiconductor layer 12, and flows in the first semiconductor layer 11 of the one light-emitting element 10, the n-side electrode 17, the n-side wire layer 22, the third metal pillar 26, and the third external terminal 26a.

In addition, the electric current is supplied to the light emitting layer 13 of the other light-emitting element 10 via the third pad 83, the p-side wire layer 21 of the other light-emitting element 10, the p-side electrode 16, and the second semiconductor layer 12, and flows in the first semiconductor layer 11 of the other light-emitting element 10, the n-side electrode 17, the n-side wire layer 22, the n-side metal pillar 24, the n-side external terminal 24a, and the second pad 82.

In other words, as schematically illustrated by the circuit symbol of the diode in FIG. 12, the two light-emitting elements 10 of the semiconductor light-emitting device 2 are connected between the first pad 81 and the second pad 82 in series.

The two light-emitting elements 10 are electrically connected to each other via the third metal pillar 26 including the third external terminal 26a. The two light-emitting elements 10 are electrically connected to each other, without the solder therebetween in a state of not being mounted on the mounting substrate 70, via the third metal pillar 26 which is formed of, for example, copper having the thermal conductivity higher than the solder. The two light-emitting elements 10 are connected to each other via the third metal pillar 26 of which the thickness is greater than those of the wire layers 21 and 22 in the package.

In other words, a plurality of chips are electrically connected to each other via the third metal pillar 26 of which the thickness is greater than the solder or the thin wire layer and which is excellent in the heat radiation. For this reason, it is possible to reduce a difference of temperature property (a difference of the light emitting property) between the plurality of chips (the semiconductor layer 15).

In addition, it is possible to efficiently radiate the heat of the light-emitting element 10 to the mounting substrate 70 side via the third external terminal 26a and via the third pad 83 which are wider and covering more area than the p-side external terminal 23a and the n-side external terminal 24a.

Moreover, since the plurality of light-emitting elements 10 may be brought close to each other in one package, it is possible to reduce the mounting space on the mounting substrate compared to a case of mounting the singulated plurality of light-emitting elements.

The number of the light-emitting elements 10 (the semiconductor layer 15) which are included in one semiconductor light-emitting device of the multi-chip package structure is not limited to the number illustrated in the above described embodiment and may be optionally selected according to the selection of the dicing areas. For example, for embodiments including more than two light-emitting elements 10, one or more light-emitting elements have two third external terminals 26a can be provided. The light-emitting elements having two third external terminals 26a can provide the electrical connection between the light-emitting elements 10 at either end of the semiconductor device 2 (i.e., the light emitting elements including the external terminals 23a, 24a.

Figure 14:
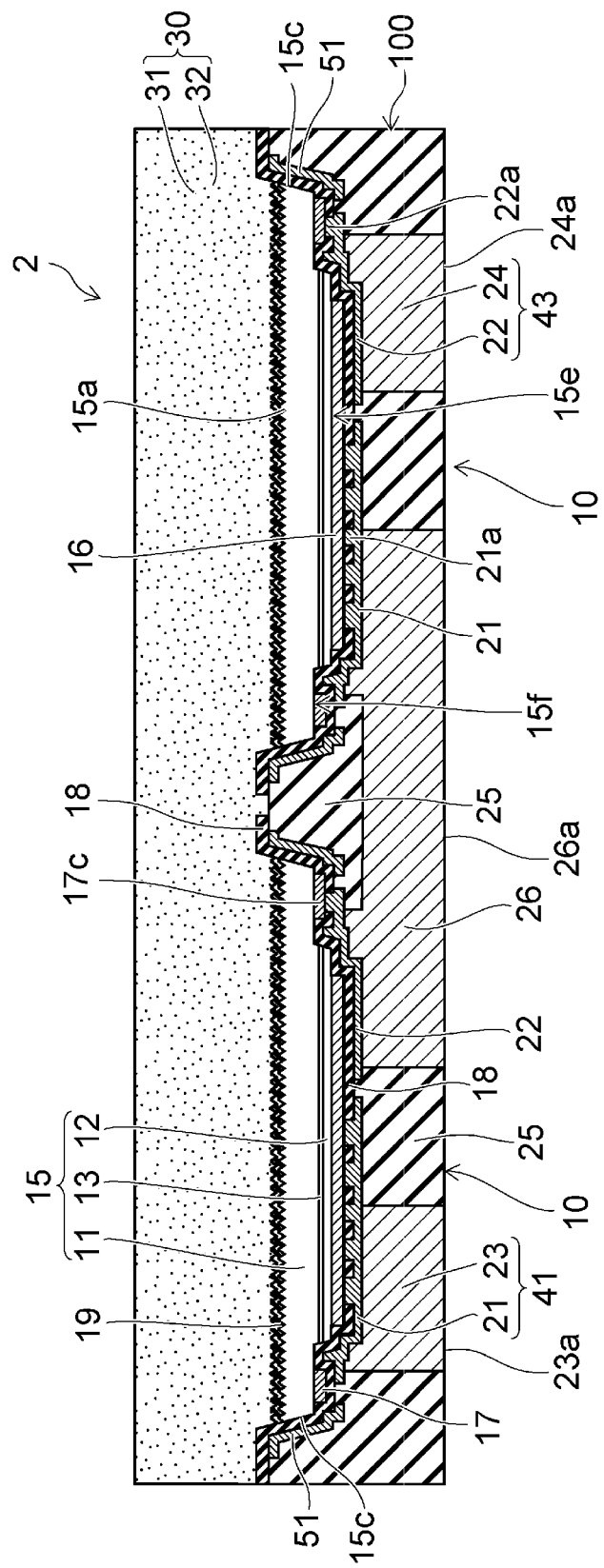
FIG. 14 is a cross-sectional view schematically illustrating a semiconductor light-emitting device according to a seventh embodiment.

Similarly, also in the structure as illustrated in FIG. 11, in the area between the semiconductor layer 15 and the semiconductor layer 15 (the area between chips), the insulating film 18 is not limited to be consecutively disposed, but may be divided into several portions as illustrated in FIG. 14. It is possible to suppress the cracks by dividing the insulating film 18 in the area between the chips by means of the patterning method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light-emitting unit, comprising:
a first pad on a mounting substrate;
a second pad on the mounting substrate and spaced from the first pad in a first direction along the mounting substrate;
a third pad on the mounting substrate and between the first pad and the second pad in the first direction; and
a semiconductor light-emitting device comprising a resin layer supporting a first light-emitting element and a second light-emitting element, each respectively having first and second external terminals which extend through the resin layer to a first surface of the resin layer facing the mounting substrate, wherein
the first external terminal of the first light-emitting element is mounted on the first pad,
the second external terminal of the first light-emitting element is mounted on the third pad,
the first external terminal of the second light-emitting element is mounted on the third pad, and
the second external terminal of the second light-emitting element is mounted on the second pad.

2. The light-emitting unit according to claim 1, wherein the first external terminal of the first light-emitting element is electrically connected to a p-side electrode of the first light-emitting element,
the first external terminal of the second light-emitting element is electrically connected to a p-side electrode of the second light-emitting element,
the second external terminal of the first light-emitting element is electrically connected to a n-side electrode of the first light-emitting element, and
the second external terminal of the second light-emitting element is electrically connected to a n-side electrode of the second light-emitting element.

3. The light-emitting unit according to claim 1, wherein the first external terminals of the first and second light-emitting elements have a planar shape at the first surface of the resin layer that is different from a planar shape of the second external terminals of the first and second light-emitting elements at the first surface of the resin layer.

4. The light-emitting unit according to claim 3, wherein
the first pad has a planar shape on the mounting substrate that corresponds to the planar shape of the first external terminal of the first light-emitting element, and
the second pad has a planar shape on the mounting substrate that corresponds to the planar shape of the second external terminal of the second light-emitting element.

5. The light-emitting unit according to claim 1, wherein the third pad has a width along the mounting substrate in a second direction perpendicular to the first direction that is greater than a width along the mounting substrate in the second direction of each of the first and second pads.

6. The light-emitting unit according to claim 5, wherein a width of the third pad in the first direction varies along the second direction.

7. The light-emitting unit according to claim 1, wherein the second external terminal of the first light-emitting element and the first external terminal of the second light-emitting element are joined with each other within resin layer and the at the first surface of the resin layer.

8. The light-emitting unit according to claim 1, wherein the semiconductor light-emitting device includes an inorganic insulating film extending continuously between the first and second light-emitting elements on a second surface of the resin layer opposite the first surface.

9. The light-emitting unit according to claim 1, further comprising:
a fourth pad on the mounting substrate, the second pad being between the third and fourth pads in the first direction, wherein
the semiconductor light-emitting device further includes a third light-emitting element supported by the resin layer and having first and second external terminals which extend through the resin layer to the first surface of the resin layer,
the first external terminal of the third light-emitting element is mounted on the second pad, and
the second external terminal of the third light-emitting element is mounted on the fourth pad.

10. The light-emitting unit according to claim 1, further comprising:
a fourth pad on the mounting substrate, the fourth pad being between the first and second pads in the first direction, and aligned with the third pad in the second direction, wherein
the semiconductor light-emitting device further includes third and fourth light-emitting elements supported by the resin layer and each respectively having first and second external terminals which extend through the resin layer to the first surface of the resin layer,
the first external terminal of the third light-emitting element is mounted on the first pad,
the second external terminal of the third light-emitting element is mounted on the fourth pad,
the first external terminal of the fourth light-emitting element is mounted on the fourth pad, and
the second external terminal of the fourth light-emitting element is mounted on the second pad.

11. The light-emitting unit according to claim 1, further comprising:
a fourth pad on the mounting substrate and aligned with the third pad along the second direction;
a fifth pad on the mounting substrate and aligned with the first pad along the second direction;
a sixth pad on the mounting substrate and aligned with the second pad along the second direction, wherein
the semiconductor light-emitting device further includes third and fourth light-emitting elements supported by the resin layer and each respectively having first and second external terminals which extend through the resin layer to the first surface of the resin layer,
the first external terminal of the third light-emitting element is mounted on the fifth pad,
the second external terminal of the third light-emitting element is mounted on the fourth pad,
the first external terminal of the fourth light-emitting element is mounted on the fourth pad, and
the second external terminal of the fourth light-emitting element is mounted on the sixth pad.

12. The light-emitting unit according to claim 1, wherein the semiconductor light-emitting device includes:
a phosphor layer on the first and second light-emitting elements; and
a light-emitting layer between the phosphor layer and the first surface of the resin layer in a direction orthogonal to the first surface.

13. The light emitting unit according to claim 1, further comprising:
a lens disposed on the first and second light-emitting unit.

14. A light-emitting unit, comprising:
a first pad on a mounting substrate;
a second pad on the mounting substrate and spaced from the first pad in a first direction along the mounting substrate;
at least one third pad between the first pad and the second pad along the first direction; and
a semiconductor light-emitting device comprising a resin layer supporting a plurality of light-emitting elements each respectively having first and second external terminals which extend through the resin layer to a first surface of the resin layer facing the mounting substrate, wherein
each third pad has the second external terminal of one light-emitting element in the plurality and the first external terminal of another light-emitting element in the plurality disposed thereon.

15. The light-emitting unit according to claim 14, wherein the plurality of light-emitting elements includes:
a first light-emitting element having a first external terminal bonded to the first pad; and
a second light-emitting element having a second external terminal bonded to the second pad, and
an area of one of the third pads facing the semiconductor light-emitting device is larger than an area of the first pad and an area of the second pad facing the semiconductor light-emitting device.

16. The light-emitting unit according to claim 14, wherein the plurality of light-emitting elements includes:
a first light-emitting element having a first external terminal bonded to the first pad; and
a second light-emitting element having a second external terminal bonded to the second pad, and
an area of one of the third pads facing the semiconductor light-emitting device is larger than a total combined area of the first pad and the second pad facing the semiconductor light-emitting device.

17. A semiconductor light-emitting device, comprising:
a plurality of light-emitting elements each of which includes a first electrode and a second electrode separated in a first direction, the plurality including:
a first light-emitting element disposed at a first end of the semiconductor light-emitting device along the first direction; and a second light-emitting element disposed at a second end of the semiconductor light-emitting device along the first direction;
  a resin layer integrally supporting the plurality of light-emitting elements;
  a first external terminal connected to a first electrode of the first light-emitting element;
  a second external terminal connected to a second electrode of the second light-emitting element; and
  a third external terminal between the first external terminal and the second external terminal along the first direction, the third external terminal being connecting in common to a first electrode of a one light-emitting element in the plurality of light-emitting elements and a second electrode of another light-emitting element in the plurality that is adjacent in the first direction to the one light-emitting element in the plurality of light-emitting elements.

18. The semiconductor light-emitting device according to claim 17, wherein an exposed area of the third external terminal is larger than an exposed area of the first external terminal and an exposed area of the second external terminal.

19. The device according to claim 17, wherein an exposed area of one of the third external terminals is larger than a combined area of an exposed area of the first external terminal and an exposed area of the second external terminal.

20. The device according to claim 17, further comprising:
a phosphor layer; and
a semiconductor layer including a light-emitting layer, the semiconductor layer between the phosphor layer and the first electrode and between the phosphor layer and the second electrode.

* * * * *